(12) United States Patent
Zhang et al.

(10) Patent No.: US 9,567,687 B2
(45) Date of Patent: Feb. 14, 2017

(54) METHOD OF ELECTROCHEMICALLY FABRICATING MULTILAYER STRUCTURES HAVING IMPROVED INTERLAYER ADHESION

(71) Applicant: University of Southern California, Los Angeles, CA (US)

(72) Inventors: Gang Zhang, Monterey Park, CA (US); Adam L. Cohen, Dallas, TX (US); Michael S. Lockard, Lake Elizabeth, CA (US); Ananda H. Kumar, Fremont, CA (US); Ezekiel J. J. Kruglick, San Diego, CA (US); Kieun Kim, Pasadena, CA (US)

(73) Assignee: University of Southern California, Los Angeles, CA (US)

( * ) Notice: Subject to any disclaimer, the term of this patent is extended or adjusted under 35 U.S.C. 154(b) by 261 days.

(21) Appl. No.: 14/185,530

(22) Filed: Feb. 20, 2014

(65) Prior Publication Data
US 2014/0216941 A1    Aug. 7, 2014

Related U.S. Application Data

(63) Continuation of application No. 13/021,939, filed on Feb. 7, 2011, now abandoned, which is a continuation
(Continued)

(51) Int. Cl.
*C25D 5/50* (2006.01)
*C25D 1/00* (2006.01)
(Continued)

(52) U.S. Cl.
CPC ............... *C25D 5/50* (2013.01); *C25D 1/003* (2013.01); *C25D 5/022* (2013.01); *C25D 5/10* (2013.01);
(Continued)

(58) Field of Classification Search
CPC ............ C25D 58/50; C25D 5/50; C25D 5/10; C25D 5/12; C25D 5/14; C25D 5/18; C25D 5/34; C25D 5/40; C25D 5/48; C25D 1/003; H05K 3/241; H05K 3/243; H01L 21/2885; H01L 21/76879
See application file for complete search history.

(56) References Cited

U.S. PATENT DOCUMENTS 3,576,722 A    4/1971    Fennimore et al.
3,620,933 A    11/1971   Grunwald et al.
(Continued)

OTHER PUBLICATIONS

Adam L. Cohen, "3-D Micromachining by Electrochemical Fabrication", Micromachine Devices, Mar. 1999, pp. 6-7.
(Continued)

*Primary Examiner* — Louis Rufo
(74) *Attorney, Agent, or Firm* — Dennis R. Smalley

(57) ABSTRACT

Multi-layer microscale or mesoscale structures are fabricated with adhered layers (e.g. layers that are bonded together upon deposition of successive layers to previous layers) and are then subjected to a heat treatment operation that enhances the interlayer adhesion significantly. The heat treatment operation is believed to result in diffusion of material across the layer boundaries and associated enhancement in adhesion (i.e. diffusion bonding). Interlayer adhesion and maybe intra-layer cohesion may be enhanced by heat treating in the presence of a reducing atmosphere that may help remove weaker oxides from surfaces or even from internal portions of layers.

22 Claims, 11 Drawing Sheets

Related U.S. Application Data of application No. 12/206,621, filed on Sep. 8, 2008, now abandoned, which is a continuation of application No. 10/841,382, filed on May 7, 2004, now abandoned, which is a continuation-in-part of application No. 10/434,289, filed on May 7, 2003, now abandoned.

(60) Provisional application No. 60/533,946, filed on Dec. 31, 2003, provisional application No. 60/506,103, filed on Sep. 24, 2003, provisional application No. 60/474,625, filed on May 29, 2003, provisional application No. 60/468,741, filed on May 7, 2003, provisional application No. 60/379,129, filed on May 7, 2002.

(51) Int. Cl.

| | |
|---|---|
| C25D 5/14 | (2006.01) |
| C25D 5/34 | (2006.01) |
| C25D 5/40 | (2006.01) |
| H01L 21/288 | (2006.01) |
| C25D 5/02 | (2006.01) |
| C25D 5/48 | (2006.01) |
| C25D 5/10 | (2006.01) |
| H01L 21/768 | (2006.01) |
| H05K 3/24 | (2006.01) |
| C25D 5/12 | (2006.01) |
| C25D 5/18 | (2006.01) |

(52) U.S. Cl.
CPC . *C25D 5/14* (2013.01); *C25D 5/18* (2013.01); *C25D 5/34* (2013.01); *C25D 5/40* (2013.01); *C25D 5/48* (2013.01); *H01L 21/2885* (2013.01); *H01L 21/76879* (2013.01); *C25D 5/12* (2013.01); *H05K 3/241* (2013.01); *H05K 3/243* (2013.01)

(56) References Cited

U.S. PATENT DOCUMENTS

| | | | |
|---|---|---|---|
| 4,093,453 A * | 6/1978 | Makino | C23C 10/28 |
| | | | 148/518 |
| 4,501,776 A | 2/1985 | Shankar | |
| 4,562,090 A * | 12/1985 | Dickson | B32B 15/015 |
| | | | 205/170 |
| 4,655,884 A * | 4/1987 | Hills | C25D 5/14 |
| | | | 205/181 |
| 4,810,332 A | 3/1989 | Pan | |
| 4,853,277 A | 8/1989 | Chant | |
| 4,995,949 A | 2/1991 | Rhoades | |
| 5,011,580 A | 4/1991 | Pan et al. | |
| 5,190,637 A * | 3/1993 | Guckel | B01D 71/02 |
| | | | 205/118 |
| 5,250,172 A | 10/1993 | Vargas-Gutierrez et al. | |
| 5,268,045 A * | 12/1993 | Clare | C23C 4/02 |
| | | | 148/518 |
| 5,641,391 A | 6/1997 | Hunter et al. | |
| 5,851,845 A | 12/1998 | Wood et al. | |
| 5,997,708 A | 12/1999 | Craig | |
| 6,027,630 A | 2/2000 | Cohen | |
| 6,150,186 A | 11/2000 | Chen et al. | |
| 6,238,465 B1 | 5/2001 | Juda et al. | |
| 6,245,249 B1 | 6/2001 | Yamada et al. | |
| 6,297,072 B1 | 10/2001 | Tilmans et al. | |
| 6,332,562 B1 | 12/2001 | Sweeton | |
| 6,332,568 B1 | 12/2001 | Christenson | |
| 6,409,072 B1 | 6/2002 | Breuer et al. | |
| 6,443,179 B1 | 9/2002 | Benavides et al. | |
| 6,458,263 B1 | 10/2002 | Morales et al. | |
| 6,500,760 B1 | 12/2002 | Peterson et al. | |
| 6,516,671 B2 | 2/2003 | Romo et al. | |
| 6,548,895 B1 | 4/2003 | Benavides et al. | |
| 6,549,700 B1 | 4/2003 | Sweatt et al. | |
| 6,557,607 B2 | 5/2003 | Yamada et al. | |
| 6,579,431 B1 * | 6/2003 | Bolcavage | B23K 20/021 |
| | | | 204/298.12 |
| 6,612,153 B2 | 9/2003 | White et al. | |
| 6,710,239 B2 | 3/2004 | Tanaka | |
| 7,001,471 B2 | 2/2006 | Ritzdorf et al. | |
| 7,309,620 B2 | 12/2007 | Fonash et al. | |
| 2002/0000271 A1 | 1/2002 | Ritzdorf et al. | |
| 2002/0045010 A1 | 4/2002 | Rohrbaugh et al. | |
| 2002/0148499 A1 | 10/2002 | Tanaka | |
| 2003/0157783 A1 | 8/2003 | Fonash et al. | |
| 2009/0142493 A1 | 6/2009 | Zhang et al. | |

OTHER PUBLICATIONS

Adam L. Cohen, "Electrochemical Fabrication (EFABTM)", Chapter 19 of the MEMS Handbook, edited by Mohamed Gad-El-Hak, CRC Press, 2002, pp. 19/1-19/23.

Adam L. Cohen, et al., "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, Sep. 1999.

Adam L. Cohen, et al., "EFAB: Rapid, Low-Cost Desktop Micromachining of High Aspect Ratio True 3-D MEMS", Proc. 12th IEEE Micro Electro Mechanical Systems Workshop, IEEE, Jan. 17-21, 1999, pp. 244-251.

Cohen, et al., "EFAB: Batch Production of Functional, Fully-Dense Metal Parts with Micron-Scale Features", Proc. 9th Solid Freeform Fabrication, The University of Texas at Austin, Aug. 1998, pp. 161.

F. Tseng, et al., "EFAB: High Aspect Ratio, Arbitrary 3-D Metal Microstructures Using a Low-Cost Automated Batch Process", 3rd International Workshop on High Aspect Ratio Microstructure Technology (HARMST'99), Jun. 1999.

F. Tseng, et al., "EFAB: High Aspect Ratio, Arbitrary 3-D Metal Microstructures Using a Low-Cost Automated Batch Process", MEMS Symposium, ASME 1999 International Mechanical Engineering Congress and Exposition, Nov. 1999.

Gang Zhang, et al., "EFAB: Rapid Desktop Manufacturing of True 3-D Microstructures", Proc. 2nd International Conference on Integrated MicroNanotechnology for Space Applications, The Aerospace Co., Apr. 1999.

"Microfabrication—Rapid Prototyping's Killer Application", Rapid Prototyping Report, CAD/CAM Publishing, Inc., Jun. 1999, pp. 1-5.

Wan-Thai Hsu, et al., "In Situ Localized Annealing for Contamination Resistance and Enhanced Stability in Nickel Micromechanical Resonators", Digest of Technical Papers, 10th International Conference on Solid-State Sensors and Actuators, Sendai, Japan, Jun. 7-10, 1999, pp. 932-935.

* cited by examiner

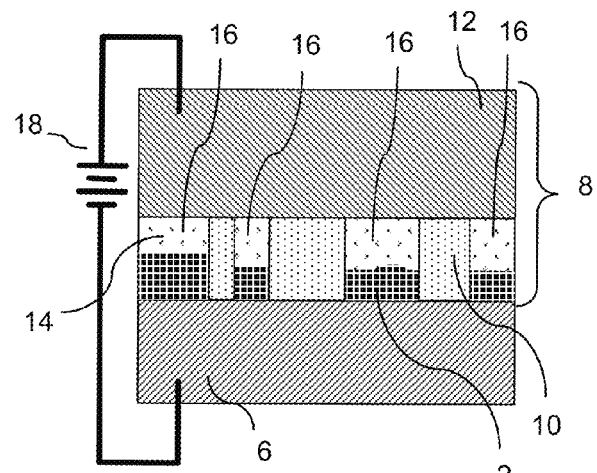
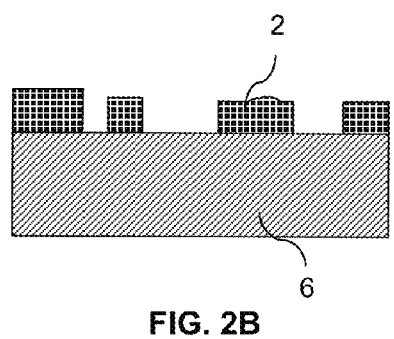
FIG. 2A (PRIOR ART)
FIG. 2B (PRIOR ART)
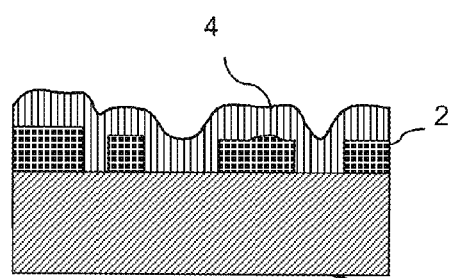
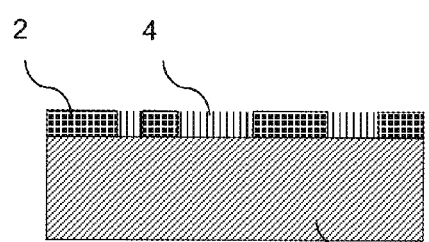
FIG. 2C (PRIOR ART)
FIG. 2D (PRIOR ART)
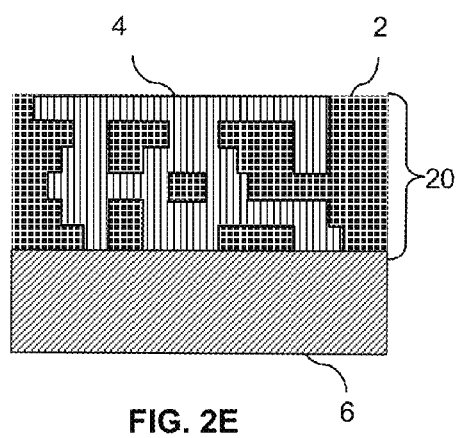
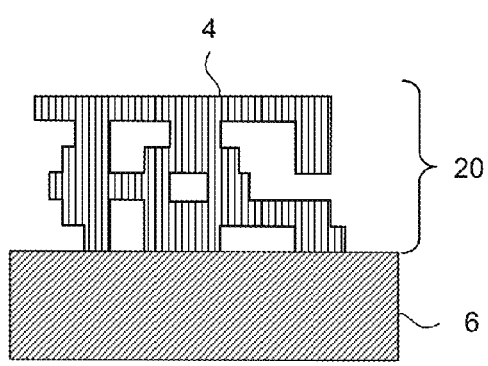
FIG. 2E (PRIOR ART)
FIG. 2F (PRIOR ART)

us 9,567,687 B2

METHOD OF ELECTROCHEMICALLY FABRICATING MULTILAYER STRUCTURES HAVING IMPROVED INTERLAYER ADHESION

RELATED APPLICATIONS

This application is a continuation of U.S. patent application Ser. No. 13/021,939 filed on Feb. 7, 2011. The '939 application is a continuation of U.S. patent application Ser. No. 12/206,621 filed on Sep. 8, 2008. The '621 application is a continuation of U.S. patent application Ser. No. 10/841,322 filed May 7, 2004. The '382 application is a continuation-in-part of U.S. patent application Ser. No. 10/434,289, filed on May 7, 2003, and claims benefit of U.S. Provisional Patent Application Nos. 60/533,946, filed on Dec. 31, 2003; 60/506,103, filed on Sep. 24, 2003; 60/474,625, filed May 29, 2003; and 60/468,741, filed May 7, 2003. The '289 application claims benefit of U.S. Provisional Patent Application No. 60/379,129, filed on May 7, 2002. Each of these applications is hereby incorporated herein by reference as if set forth in full.

FIELD OF THE INVENTION

The embodiments of various aspects of the invention relate generally to the formation of three-dimensional structures (e.g. meso-scale or microscale structures) using electrochemical fabrication methods wherein heat treatment is provided to improve interlayer adhesion.

BACKGROUND

A technique for forming three-dimensional structures (e.g. parts, components, devices, and the like) from a plurality of adhered layers was invented by Adam L. Cohen and is known as Electrochemical Fabrication. It is being commercially pursued by Microfabrica™ Inc. of Van Nuys, Calif. under the name EFAB®. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica™ Inc. of Van Nuys, Calif. such masks have come to be known as INSTANT MASKS™ and the process known as INSTANT MASKING or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

(1) A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p 161, August 1998.
(2) A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p 244, January 1999.
(3) A. Cohen, "3-D Micromachining by Electrochemical Fabrication", Micromachine Devices, March 1999.
(4) G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.
(5) F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.
(6) A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.
(7) F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.
(8) A. Cohen, "Electrochemical Fabrication (EFAB™)", Chapter 19 of The MEMS Handbook, edited by Mohamed Gad-El-Hak, CRC Press, 2002.
(9) "Microfabrication—Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.
2. Then, blanket depositing at least one additional material by electrodeposition so that the additional deposit covers both the regions that were previously selectively deposited onto, and the regions of the substrate that did not receive any previously applied selective depositions.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. FIG. 1A also depicts a substrate 6 separated from mask 8. One is as a supporting material for the patterned insulator 10 to maintain its integrity and alignment since the pattern may be topologically complex (e.g., involving isolated "islands" of insulator material). The other function is an anode for the electroplating operation. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating as individual masks are not intentionally destroyed in the removal process, they may be usable in multiple plating operations.

Another example of a CC mask and CC mask plating is shown in FIGS. 1D-1F. FIG. 1D shows an anode 12' separated from a mask 8' that includes a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously, prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the cathode 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A-3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3C includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply for driving the blanket deposition process.

The planarization subsystem 40 is shown in the lower portion of FIG. 3C and includes a lapping plate 52 and associated motion and control systems (not shown) for planarizing the depositions.

In addition to teaching the use of CC masks for electrodeposition purposes, the '630 patent also teaches that the CC masks may be placed against a substrate with the polarity of the voltage reversed and material may thereby be selectively removed from the substrate. It indicates that such removal processes can be used to selectively etch, engrave, and polish a substrate, e.g., a plaque.

The '630 patent further indicates that the electroplating methods and articles disclosed therein allow fabrication of devices from thin layers of materials such as, e.g., metals, polymers, ceramics, and semiconductor materials. It further indicates that although the electroplating embodiments described therein have been described with respect to the use of two metals, a variety of materials, e.g., polymers, ceramics and semiconductor materials, and any number of metals can be deposited either by the electroplating methods therein, or in separate processes that occur throughout the electroplating method. It indicates that a thin plating base can be deposited, e.g., by sputtering, over a deposit that is insufficiently conductive (e.g., an insulating layer) so as to enable subsequent electroplating. It also indicates that multiple support materials (i.e. sacrificial materials) can be included in the electroplated element allowing selective removal of the support materials.

Another method for forming microstructures from electroplated metals (i.e. using electrochemical fabrication techniques) is taught in U.S. Pat. No. 5,190,637 to Henry Guckel, entitled "Formation of Microstructures by Multiple Level Deep X-ray Lithography with Sacrificial Metal layers". This patent teaches the formation of metal structure utilizing mask exposures. A first layer of a primary metal is electroplated onto an exposed plating base to fill a void in a photoresist, the photoresist is then removed and a secondary metal is electroplated over the first layer and over the plating base. The exposed surface of the secondary metal is then machined down to a height which exposes the first metal to produce a flat uniform surface extending across the both the primary and secondary metals. Formation of a second layer may then begin by applying a photoresist layer over the first layer and then repeating the process used to produce the first layer. The process is then repeated until the entire structure is formed and the secondary metal is removed by etching. The photoresist is formed over the plating base or previous layer by casting and the voids in the photoresist are formed by exposure of the photoresist through a patterned mask via X-rays or UV radiation.

Another method of forming multilayer microstructures is taught in U.S. Pat. No. 6,332,568 to Todd Christenson, entitled "Wafer Scale Micromachine Assembly Method". This patent describes a method for fusing together, using diffusion bonding, micromachine subassemblies which are separately fabricated. First and second micromachine subassemblies are fabricated on a first and second substrate, respectively. The substrates are positioned so that the upper surfaces of the two micromachine subassemblies face each other and are aligned so that the desired assembly results from their fusion. The upper surfaces are then brought into contact, and the assembly is subjected to conditions suited to the desired diffusion bonding.

The formation of a micromechanical resonator was described by Wan-Thai Hsu, Seungbae Lee, and Clark T. C. Nguyen in a paper entitled "In Situ Localized Annealing for Contamination Resistance and Enhanced Stability in Nickel Micromechanical Resonators" published in "Digest of Technical Papers, 10th International Conference on Solid-State Sensors and Actuators", Sendai Japan, Jun. 7-10, 1999, pp. 932-935. This paper describes a technique in which a micromechanical resonator is operated at large amplitudes while in situ localized annealing occurs at temperatures exceeding 880° C. Such annealing is shown to be an effective method for both removal of surface contaminants and for possible "redistribution" of the structural material towards substantially higher quality factor Q and greatly enhanced drift stability. The technique not only provides insight identifying contamination as a dominant mechanism for Q-degradation in nickel-plated micromechanical resonators exposed to uncontrolled environments, but also offers a convenient method for restoring a contaminated device to its original high-Q (Q=14,172) characteristics. This paper further describes a process for producing a nickel microresonator on which testing may be performed. The process begins with a silicon substrate on which 2 microns of oxide was grown. Next 300 angstroms of titanium and 2700 angstroms of gold were evaporated and then patterned to form interconnects. Next 1.8 microns of aluminum was evaporated and then vias were patterned into the aluminum to expose the underlying gold. Next, nickel plating was used to create deposits that filled the vias and was timed such that a planarized nickel aluminum surface was achieved in the regions of the vias. Next a 200 angstrom deposit of nickel was evaporated over the entire surface. This evaporated deposit served as a seed layer and as the beginning of structural layer processing. A photoresist mold was then formed over the evaporated nickel and then 3 microns of nickel was plated into mold. The mold and seed layer were then removed and thereafter the aluminum was removed. The paper provides an SEM image of the resonator as well as a schematic of the electrical set up for testing.

A need exists in the art for improving adhesion between the layers of a multilayer structure when those layers are not formed separate from one another but are formed in intimate contact with one another and already adhered to one another prior to heat treatment.

SUMMARY OF THE DISCLOSURE

It is an object of at least one aspect of the invention to provide an electrochemical fabrication technique that yields improved properties of fabricated structures.

It is an object of at least one aspect of the invention to provide an electrochemical fabrication technique that yields improved interlayer adhesion.

It is an object of at least one aspect of the invention to provide a heat treated structure having significantly improved interlayer adhesion while not significantly reducing the yield strength of the intra-layer material.

It is an object of at least one aspect of the invention to reduce the presence of metallic oxides that may be located along the interfaces between successively deposited layers or portions of layers.

It is an object of at least one aspect of the invention to provide a heat treated structure having improved properties where the structure remains protected by a sacrificial material until it is time for use.

Other objects and advantages of various aspects of the invention will be apparent to those of skill in the art upon review of the teachings herein. The various aspects of the invention, set forth explicitly herein or otherwise ascertained from the teachings herein, may address any one of the above objects alone or in combination, or alternatively they may not address any of the objects set forth above but instead address some other object of the invention which may be ascertained from the teachings herein. It is not intended that all of these objects be addressed by any single aspect of the invention even though that may be the case with regard to some aspects.

In a first aspect of the invention, a fabrication process for forming a multi-layer three-dimensional structure, includes: (a) forming and adhering a layer of material to a previously formed layer and/or to a substrate, wherein the layer includes a desired pattern of at least one material; and (b) repeating the forming and adhering operation of (a) at least twice to build up a three-dimensional structure from a plurality of adhered layers, wherein the desired patterning on at least two layers is different; (c) after formation of at least a plurality of layers, subjecting the multi-layer structure to a heat treatment; wherein the structure includes at least one metal, and wherein formation of the desired pattern for at least one layer includes use of an adhered mask.

In a second aspect of the invention, a fabrication process for forming a multi-layer three-dimensional structure, includes: forming a patterned deposit of at least one first material on to a substrate or previously deposited material such that at least one void exists around or within the patterned deposit of the at least first material; depositing at least one second material into at least a portion of the at least one void; (c) trimming the deposit of at least one of the at least one first material or the at least one second material to a desired level; (d) repeating the forming and adhering operations of (a)-(c) a plurality of times to build up a three-dimensional structure from a plurality of adhered layers; (e) after formation of at least a plurality of layers, subjecting the multi-layer structure to heat treatment, wherein at least one deposited material includes a metal, and wherein the forming of the patterned deposit for at least one layer includes use of an adhered mask.

In a third aspect of the invention, a fabrication process for forming a multi-layer three-dimensional structure, includes: (a) forming and adhering a layer to a previously formed layer and/or to a substrate; and (b) repeating the forming and adhering operation of (a) at least once to build up a three-dimensional structure from a plurality of adhered layers, wherein at least a plurality of the layers each include at least two deposited materials; (c) after formation of at least a plurality of layers and while at least two materials remain in contact adhered to one another, subjecting the multi-layer structure to a heat treatment; wherein the structure includes at least one metal.

In a fourth aspect of the invention, a fabrication process for forming a multi-layer three-dimensional structure, includes: (a) forming and adhering a layer to a previously formed layer and/or to a substrate; and (b) repeating the forming and adhering operation of (a) at least once to build up a three-dimensional structure from a plurality of adhered layers, wherein the forming of at least a plurality of layers includes removing at least some deposited material in a planarization operation; (c) after formation of at least a plurality of layers, subjecting the multi-layer structure to a heat treatment; wherein the structure includes at least one metal, and wherein the forming and adhering of at least one layer includes use of an adhered mask in the selective patterning of at least one material.

In a fifth aspect of the invention, a fabrication process for forming a multi-layer three-dimensional structure, includes: (a) forming and adhering a layer to a previously formed layer and/or to a substrate, wherein the layer includes a desired pattern of at least one material; and (b) repeating the forming and adhering operation of (a) at least once to build up a three-dimensional structure from a plurality of adhered layers, wherein the desired patterning of at least one material deposited on a subsequent layer adheres directly to the desired patterning of at least one material deposited on a preceding layer; (c) after formation of at least a plurality of layers, subjecting the multi-layer structure to a heat treatment; wherein the structure includes at least one metal, and wherein the forming and adhering of at least one layer includes use of an adhered mask in the selective patterning of at least one material.

In a sixth aspect of the invention, a fabrication process for forming a multi-layer three-dimensional structure, includes: (a) forming and adhering a layer to a previously formed layer and/or to a substrate, wherein the layer includes a desired pattern of at least one material; and (b) repeating the forming and adhering operation of (a) at least once to build up a three-dimensional structure from a plurality of adhered layers; (c) after formation of at least a plurality of layers, subjecting the multi-layer structure to a heat treatment, wherein the structure is heated in a manner such that any local temperature variations within the structure do not directly result from localized differences in electrical conductivity of the structural material; wherein the structure includes at least one metal, and wherein the forming and adhering of at least one layer includes use of an adhered mask in the selective patterning of at least one material.

In a seventh aspect of the invention, a fabrication process for forming a multi-layer three-dimensional structure, includes: (a) forming and adhering a layer to a previously formed layer and/or to a substrate, wherein the layer includes a desired pattern of at least one material; and (b) repeating the forming and adhering operation of (a) at least once to build up a three-dimensional structure from a plurality of adhered layers; (c) after formation of at least a plurality of layers, subjecting the multi-layer structure to a heat treatment such that substantially all portions of the structure are heated to a substantially uniform temperature; wherein the structure includes at least one metal.

In an eighth aspect of the invention, a fabrication process for forming a multi-layer three-dimensional structure, includes: (a) forming and adhering a layer to a previously formed layer and/or to a substrate, wherein the layer includes a desired pattern of at least one material; and (b) repeating the forming and adhering operation of (a) at least once to build up a three-dimensional structure from a plurality of adhered layers; (c) after formation of at least a plurality of layers, subjecting the multi-layer structure to a heat treatment, wherein a maximum temperature during heat treatment is less than a recrystallization temperature of at least one metal forming part of the structure, and wherein the forming and adhering of at least one layer includes use of an adhered mask in the selective patterning of at least one material.

In a ninth aspect of the invention, a fabrication process for forming a multi-layer three-dimensional structure, includes: (a) forming and adhering a layer to a previously formed layer and/or to a substrate, wherein the layer includes a desired pattern of at least one material; and (b) repeating the forming and adhering operation of (a) at least once to build up a three-dimensional structure from a plurality of adhered layers, wherein at least a plurality of the layers each include at least one structural material and at least one sacrificial material; (c) separating the sacrificial material from the structure to release the structure; and (d) after formation of at least a plurality of layers but prior to release, subjecting the multi-layer structure to a heat treatment; wherein the structure includes at least one metal, and wherein the forming and adhering of at least one layer includes use of an adhered mask in the selective patterning of at least one material.

In a tenth aspect of the invention, a fabrication process for forming a multi-layer three-dimensional structure, includes: (a) forming and adhering a layer to a previously formed layer and/or to a substrate, wherein the layer includes a desired pattern of at least one material; and (b) repeating the forming and adhering operation of (a) at least once to build up a three-dimensional structure from a plurality of adhered layers, wherein at least a plurality of the layers each include at least one structural material and at least one sacrificial material, and wherein the desired patterning on at least two layers is different; (c) separating the sacrificial material from the structure to release the structure; and (d) after release, subjecting the multi-layer structure to a heat treatment; wherein the structure includes at least one metal, and wherein the forming and adhering of at least one layer includes use of an adhered mask in the selective patterning of at least one material In an eleventh aspect of the invention, a fabrication process for forming a multi-layer three-dimensional structure, includes: (a) forming and adhering a layer to a previously formed layer and/or to a substrate, wherein the layer includes a desired pattern of at least one material; and (b) repeating the forming and adhering operation of (a) at least once to build up a three-dimensional structure from a plurality of adhered layers; (c) subjecting the multi-layer structure to a heat treatment while the structure is located in a selected atmosphere including an inert gas, wherein the structure includes at least one metal.

In a twelfth aspect of the invention, a fabrication process for forming a multi-layer three-dimensional structure, includes: (a) forming and adhering a layer to a previously formed layer and/or to a substrate, wherein the layer includes a desired pattern of at least one material; and (b) repeating the forming and adhering operation of (a) at least once to build up a three-dimensional structure from a plurality of adhered layers; (c) subjecting the multi-layer structure to a heat treatment while the structure is located in a selected atmosphere including a reducing gas, wherein the structure includes at least one metal.

In a thirteenth aspect of the invention, a fabrication process for forming a multi-layer three-dimensional structure, includes: (a) forming and adhering a layer to a previously formed layer and/or to a substrate, wherein the layer includes a desired pattern of at least one material; and (b) repeating the forming and adhering operation of (a) at least once to build up a three-dimensional structure from a plurality of adhered layers, wherein at least a plurality of the layers each include at least one structural material and at least one sacrificial material, and wherein the desired patterning on at least two layers is different; (c) separating the sacrificial material from the structure to release the structure; (d) after release, subjecting the multi-layer structure to a heat treatment; (e) after the heat treatment, applying a second sacrificial material to the structure, wherein the structure includes at least one metal.

In a fourteenth aspect of the invention, a fabrication process for forming a multi-layer three-dimensional structure, includes: (a) forming and adhering a layer of material to a previously formed layer and/or to a substrate, wherein the layer includes a desired pattern of at least one material; and (b) repeating the forming and adhering operation of (a) at least twice to build up a three-dimensional structure from a plurality of adhered layers; (c) after formation of at least a plurality of layers, subjecting the multi-layer structure to a heat treatment; and (d) releasing the structure from the substrate, wherein the structure includes at least one metal, and wherein the forming and adhering of at least one layer includes use of an adhered mask in the selective patterning of at least one material.

In a fifteenth aspect of the invention, a fabrication process for forming a multi-layer three-dimensional structure, includes: A fabrication process for forming a multiple multi-layer three-dimensional structures, including: (a) forming and adhering a layer of material to a previously formed layer and/or to a substrate, wherein the layer includes a desired pattern of at least one material; and (b) repeating the forming and adhering operation of (a) at least twice to build up a plurality of three-dimensional structures from a plurality of adhered layers; (c) after formation of at least a plurality of layers, subjecting the multi-layer structure to a heat treatment; and (d) dicing the plurality of structures from one another, wherein the structure includes at least one metal.

In a sixteenth aspect of the invention, a fabrication process for forming a multi-layer three-dimensional structure, includes: (a) forming and adhering a layer to a previously formed layer and/or to a substrate, wherein the layer includes a desired pattern of at least one material; and (b) repeating the forming and adhering operation of (a) at least once to build up a three-dimensional structure from a plurality of adhered layers; (c) after formation of at least a plurality of layers, subjecting the multi-layer structure to a heat treatment, wherein a maximum effective temperature during heat treatment is less than a recrystallization temperature of at least one metal forming part of the structure, and wherein the heat treatment is applied for a sufficient time and at a sufficient temperature and in an environment that allows interlayer adhesion to be enhanced a substantial amount, and wherein the forming and adhering of at least one layer includes use of an adhered mask in the selective patterning of at least one material.

In a seventeenth aspect of the invention, a fabrication process for forming a multi-layer three-dimensional structure, includes: (a) forming and adhering a layer to a previously formed layer and/or to a substrate, wherein the layer includes a desired pattern of at least one material; and (b) repeating the forming and adhering operation of (a) at least once to build up a three-dimensional structure from a plurality of adhered layers; (c) after formation of at least a plurality of layers, subjecting the multi-layer structure to a heat treatment, wherein the heat treatment is applied to the structure for a temperature, a time, and in an environment such that a substantial increase in interlayer adhesion results without significantly reducing the yield strength of the intra-layer material, and wherein the forming and adhering of at least one layer includes use of an adhered mask in the selective patterning of at least one material.

In an eighteenth aspect of the invention, a fabrication process for forming a multi-layer three-dimensional structure, includes: (a) forming and adhering a layer to a previously formed layer and/or to a substrate, wherein the layer includes a desired pattern of at least one material; and (b) repeating the forming and adhering operation of (a) at least once to build up a three-dimensional structure from a plurality of adhered layers; (c) after formation of at least a plurality of layers, subjecting the multi-layer structure to a heat treatment, wherein the heat treatment results in the formation of a structure which behaves monolithically up to at least 50% of the yield strength of the intra-layer material, and wherein the forming and adhering of at least one layer includes use of an adhered mask in the selective patterning of at least one material.

In a nineteenth aspect of the invention, a fabrication process for forming a multi-layer three-dimensional structure, includes: (a) forming and adhering a layer to a previously formed layer and/or to a substrate, wherein the layer includes a desired pattern of at least one material; and (b) repeating the forming and adhering operation of (a) at least once to build up a three-dimensional structure from a plurality of adhered layers; (c) after formation of at least a plurality of layers, subjecting the multi-layer structure to a heat treatment, wherein the heat treatment results in the formation of a structure which is no more likely to experience interlayer adhesion failure than intra-layer cohesion failure when applied stress is at least 50% of the yield strength of the intra-layer material.

Further aspects of the invention will be understood by those of skill in the art upon reviewing the teachings herein. Other aspects of the invention may involve combinations of the above noted aspects of the invention and/or addition of various features of one or more embodiments. Other aspects of the invention may involve apparatus that are configured to implement one or more of the above process aspects of the invention. These other aspects of the invention may provide various combinations of the aspects presented above as well as provide other configurations, structures, functional relationships, and processes that have not been specifically set forth above but which are ascertainable from the teachings herein.

BRIEF DESCRIPTION OF THE DRAWINGS

FIGS. 2A-2F schematically depict side views of various stages of an electrochemical fabrication process as applied to the formation of a particular structure where a sacrificial material is selectively deposited while a structural material is blanket deposited.

DETAILED DESCRIPTION

FIGS. 1A-1G, FIGS. 2A-2F, and FIGS. 3A-3C illustrate various features of one form of electrochemical fabrication that are known. Other electrochemical fabrication techniques are set forth in the '630 patent referenced above (and in pending U.S. patent application Ser. No. 09/493,496 which a divisional of the application that lead to the '630 patent and is hereby incorporated herein by reference), in the various previously incorporated publications, in various other patents and patent applications incorporated herein by reference, still others may be derived from combinations of various approaches described in these publications, patents, and applications, or are otherwise known or ascertainable by those of skill in the art from the teachings set forth herein. All of these techniques may be combined with those of the various embodiments of various aspects of the invention explicitly set forth herein to yield enhanced embodiments. Still other embodiments may be derived from combinations of the various embodiments explicitly set forth herein.

Figure 1A:
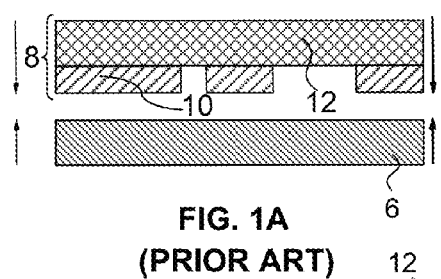
FIGS. 1A-1C schematically depict side views of various stages of a CC mask plating process, while FIGS. 1D-1G schematically depict a side views of various stages of a CC mask plating process using a different type of CC mask.
Figure 1B:
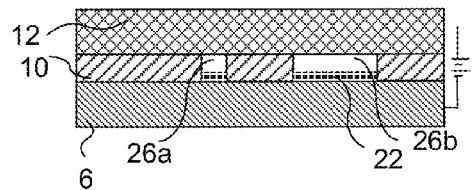
Figure 1C:
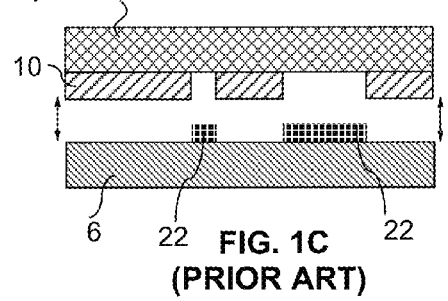
Figure 1D:
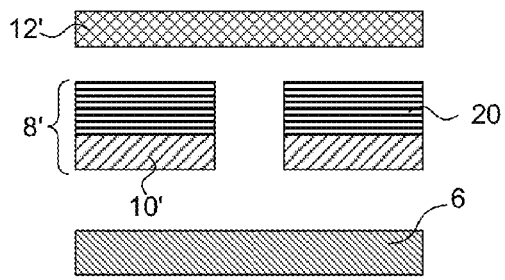
Figure 1E:
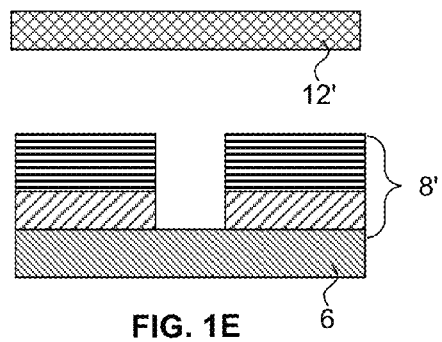
Figure 1F:
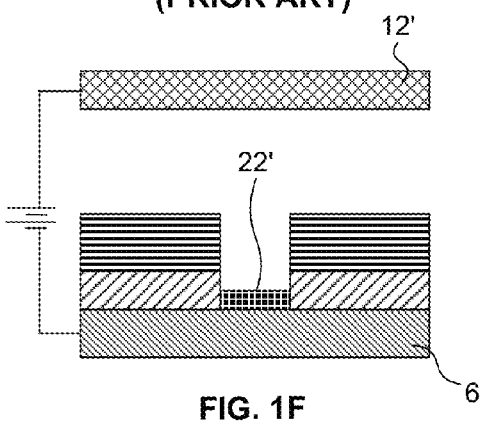
Figure 1G:
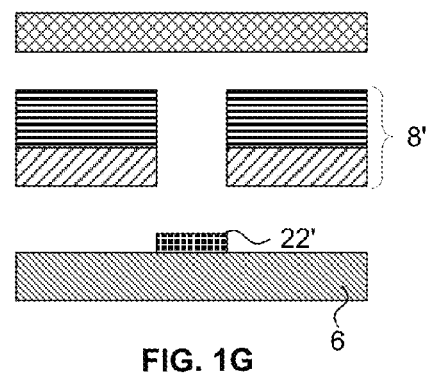
Figure 3A:
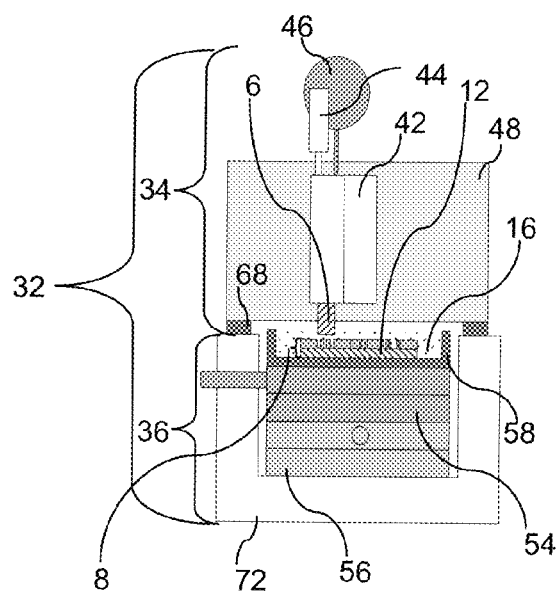
FIGS. 3A-3C schematically depict side views of various example subassemblies that may be used in manually implementing the electrochemical fabrication method depicted in FIGS. 2A-2F.
Figure 3B:
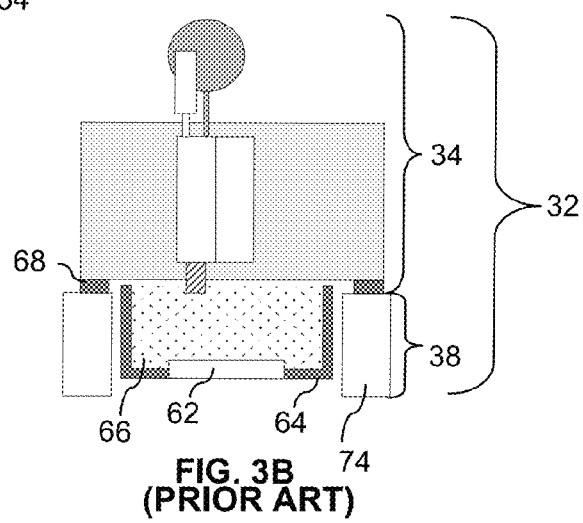
Figure 3C:
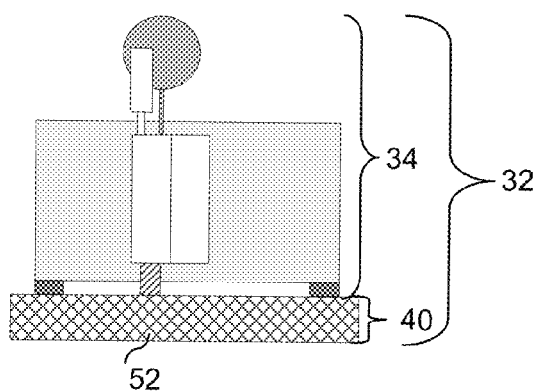
Figure 4A:
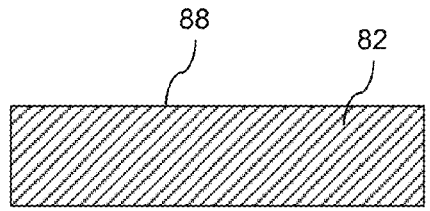
FIGS. 4A-4G schematically depict the formation of a first layer of a structure using adhered mask plating where the blanket deposition of a second material overlays both the openings between deposition locations of a first material and the first material itself.
Figure 4B:
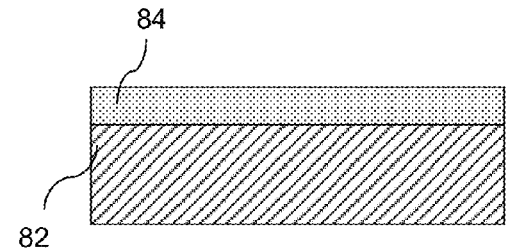
Figure 4C:
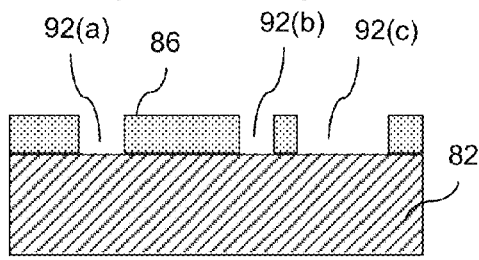
Figure 4D:
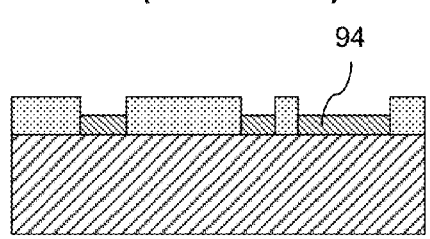
Figure 4E:
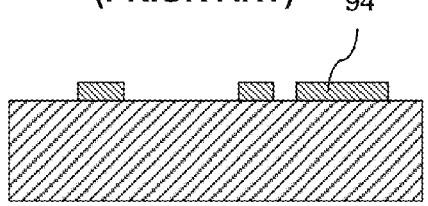
Figure 4F:
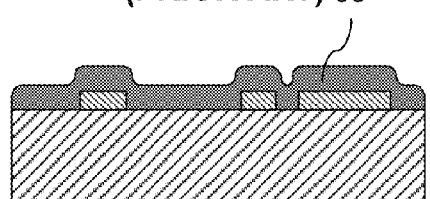
Figure 4G:
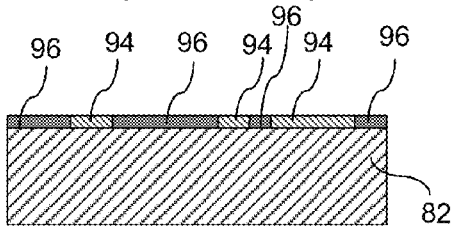
Figure 4H:
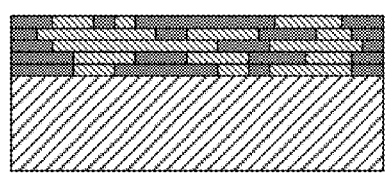
FIG. 4H shows the result of repeating the process steps shown in FIGS. 4B-4G several times to form a multi-layer structure where each layer consists of two materials.
Figure 4I:
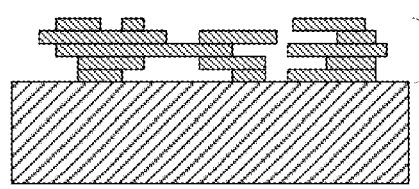
FIG. 4I shows the state of the process following that shown in FIG. 4H after removing one of the materials to yield a desired 3-D structure.

FIGS. 4A-4G illustrate various stages in the formation of a single layer of a multi-layer fabrication process where a second metal is deposited on a first metal as well as in openings in the first metal where its deposition forms part of the layer. In FIG. 4A, a side view of a substrate 82 is shown, onto which patternable photoresist 84 is cast as shown in FIG. 4B. In FIG. 4C, a pattern of resist is shown that results from the curing, exposing, and developing of the resist. The patterning of the photoresist 84 results in openings or apertures 92(a)-92(c) extending from a surface 86 of the photoresist through the thickness of the photoresist to surface 88 of the substrate 82. In FIG. 4D, a metal 94 (e.g. nickel) is shown as having been electroplated into the openings 92(a)-92(c). In FIG. 4E, the photoresist has been removed (i.e. chemically stripped) from the substrate to expose regions of the substrate 82 which are not covered with the first metal 94. In FIG. 4F, a second metal 96 (e.g., silver) is shown as having been blanket electroplated over the entire exposed portions of the substrate 82 (which is conductive) and over the first metal 94 (which is also conductive). FIG. 4G depicts the completed first layer of the structure which has resulted from the planarization of the first and second metals down to a height that exposes the first metal and sets a thickness for the first layer. FIG. 4H shows the result of repeating the process steps shown in FIGS. 4B-4G several times to form a multi-layer structure where each layer consists of two materials. For most applications one of these materials is removed as shown in FIG. 4I to yield a desired 3-D structure 98 (e.g. component or device).

The various embodiments, alternatives, and techniques disclosed herein may be used in combination with electrochemical fabrication techniques that use different types of patterning masks and masking techniques. For example, conformable contact masks and masking operations may be used, proximity masks and masking operations may be used (i.e. operations that use masks that at least partially selectively shield a substrate by their proximity to the substrate even if contact is not made), non-conformable masks and masking operations may be used (i.e. masks and operations based on masks whose contact surfaces are not significantly conformable), and adhered masks and masking operations may be used (masks and operations that use masks that are adhered to a substrate onto which selective deposition or etching is to occur as opposed to only being contacted to it).

In still other embodiments, shielded conductive probes may be used as a form of direct writing of patterned deposits. An example of such an approach is found in U.S. Pat. No. 5,641,391 to Hunter et al., entitled "Three Dimensional Microfabrication By Localized Electrodeposition and Etching" which is hereby incorporated herein by reference. In still other embodiments multiple probes may be used simultaneously or multi-cell masks may be used that allow selective cell-by-cell deposition or etching. Such masks and their use are described in U.S. patent application Ser. No. 10/677,498, filed on Oct. 1, 2003, and entitled "Selective Electrochemical Deposition Methods Using Pyrophosphate Copper Plating Baths Containing Ammonium Salts, Citrate Salts and/or Selenium Oxide". This patent and application are incorporated herein by reference as if set forth in full herein.

Various embodiments of various aspects of the invention are directed to formation of three-dimensional structures from materials some of which are to be electrodeposited or electroless deposited. Some of these structures may be formed from a plurality of layers of one or more deposited materials (e.g. 3 or more layers, more preferably five or more layers, and most preferably ten or more layers). In some embodiments structures having features positioned with micron level precision (e.g. less than 5 microns, preferably less than 1 micron and more preferably less than about 0.5 microns) and minimum features size on the order of microns or tens of microns (e.g. less than 20 microns, preferably less than 10 microns, and more preferably less than about 1 micron). In other embodiments structures with less precise feature placement and/or larger minimum features may be formed. In still other embodiments, higher precision and smaller minimum feature sizes may be desirable.

Various embodiments disclosed herein or portions of those embodiments may be supplemented by the above incorporated and known techniques by adding to them (for the formation of any given structure) processes that involve the selective etching of deposited material and the filling of created voids with additional materials. Various other embodiments of various aspects of the invention, may depart from the selective deposition of materials entirely, and use blanket electrodeposition operations to deposit materials and selective etching operations to pattern those materials by creating voids that can be filled in using blanket deposition operations. Various other embodiments may cause deposition of material to deviate from a strict layer-by-layer build up process. In a strict layer-by-layer build up process each layer is complete formed prior to beginning formation of a subsequent layer, e.g. an $n^{th}$ layer is completely formed prior to beginning deposition operations for forming a portion of an $(n+1)^{th}$ layer. In these alternative processes, formation of an $(n+1)^{th}$ layer begins prior to completing the formation of an $n^{th}$ layer. All of these techniques are considered generalized layer-by-layer formation processes and they are used to produce multilayer structures where successively formed layers are adhered to previously formed adjacent layers. Such teachings are further described in U.S. patent application Ser. No. 10/434,519, filed May 7, 2003 by Smalley, and entitled "Methods of and Apparatus for Electrochemically Fabricating Structures Via Interlaced Layers or Via Selective Etching and Filling of Voids". This patent application is hereby incorporated herein by reference as if set forth in full.

Other embodiments may use other forms of depositing material. For example, in some embodiments deposition of material may occur via chemical or physical vapor deposition (e.g. evaporation or sputtering), spreading, spraying, or the like. In some embodiments spray metal coating processes may be used to obtain blanket or selective depositions. Spray metal coating techniques for forming three dimensional structures and particularly microstructures are described in U.S. patent application Ser. No. 10/697,597, filed on Oct. 29, 2003 by Lockard et al., and entitled "EFAB Methods and Apparatus Including Spray Metal or Powder Coating Processes". This patent application is hereby incorporated herein by reference. In some embodiments the heat treating operations may be used in conjunction with porous structural materials to improve adhesion between the individual particles and/or to aid in infiltrating a filler material into the pores of the structural material.

In still other embodiments heat treatment that improves interlayer adhesion may be combined with other post layer formation operations. For example packaging or hermetic sealing operations may be performed in conjunction with heat treatment operations. Hermetic sealing of packaging structures that surround components or other devices is described in U.S. patent application Ser. No. 10/434,103, filed on May 7, 2003, by Cohen et al, and entitled "Electrochemically Fabricated Hermetically Sealed Microstructures and Methods of and Apparatus for Producing Such Structures". This patent application is hereby incorporated herein by reference in its entirety.

Figure 5:
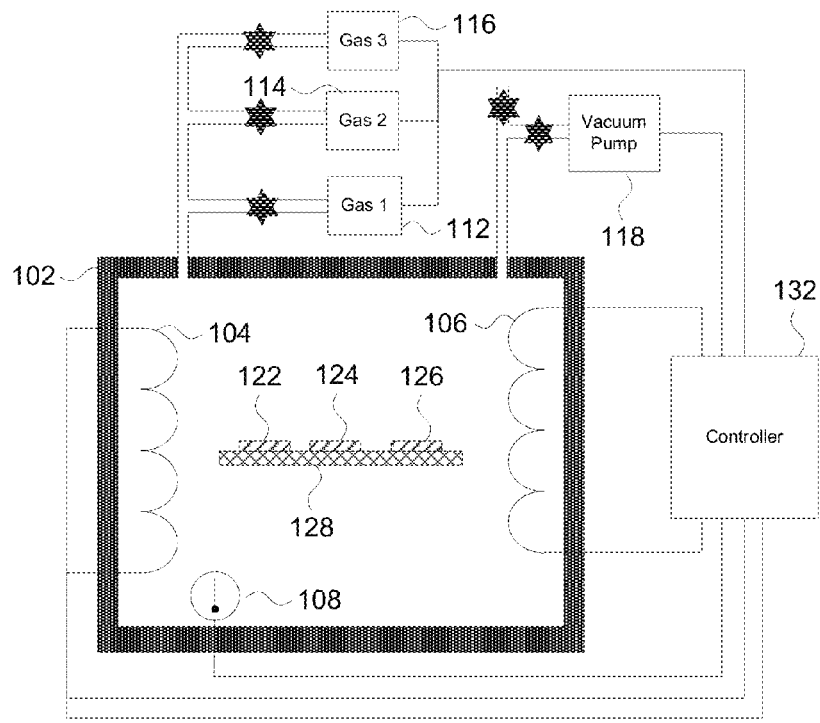
FIG. 5 schematically depicts a heating system in which multiple structures have been placed for heat treatment (e.g. diffusion bonding) in accordance with various embodiments of the invention.

FIG. 5 schematically depicts a heating system in which multiple structures have been placed for heat treatment (e.g. diffusion bonding) according to various embodiments of the invention. The system contains a heating chamber 102 which includes resistive heating elements 104 and 106 and temperature sensing device 108. The heating chamber may be selectively filled with any of a number of gases as indicated by elements 112, 114, and 116. Alternatively the chamber may be evacuated using a vacuum pump 118. Filling with gas may occur after evacuation or result from a purging process that uses the gas via one or more outlets located on the chamber. One or more structures (for example structures 122, 124, or 126) may be placed in the chamber on support 128. Controller 132 may then be operated to evacuate the chamber or fill it with an appropriate gas and then it may supply power to heating coils 104 and 106 to raise the temperature within the chamber at a controlled rate and to a controlled final temperature after which the temperature may be lowered in a controlled manner or the system may simply be shut off and the temperature allowed to lower as a result of heat dissipation from the chamber. Temperature sensor 108 may be used by the controller in a feedback loop to ensure appropriate operation occurs. The controller 132 may be a programmable device with an appropriate control panel and display panel. In other heating systems multiple temperature sensors may be used and heat may be applied to the sample in other ways. For example, inductive coupling may be used to heat the samples burning of a fuel source may be used to supply heat via convection, conduction and/or radiative effects. Heating elements may be located below, beside, and/or above the structures to be heated. The chamber may also include a fan or other elements for enhancing flow of gas within the chamber. In some embodiments direct application of current applied to the sample or samples may be used. This latter approach would seem particularly viable when the structure remains embedded in a conductive sacrificial material but it may also have application when structures are released and of a design that would allow reasonably uniform current flow through all portions of the structure or where heat conduction via the structure itself may allow reasonable heat transfer and temperatures to be obtained.

Figure 6:
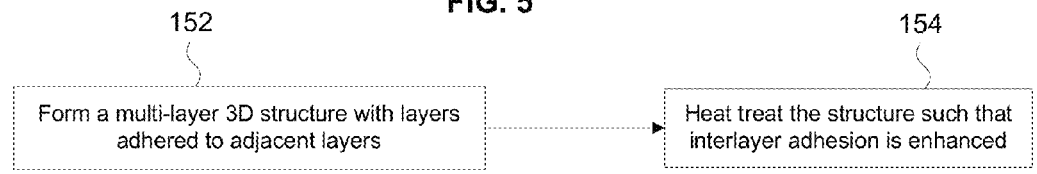
FIG. 6 depicts a block diagram of a first embodiment of the invention where a multilayer three-dimensional structure is formed and then heat treated such that, for example, interlayer adhesion is improved.

FIG. 6 depicts a block diagram of a first embodiment of the invention where a multilayer three-dimensional structure is formed and then heat treated such that, for example, interlayer adhesion is improved. Element 152 of FIG. 6 calls for the formation of a multi-layer structure from a plurality of adhered layers. This formation process may involve one of the electrochemical fabrication processes discussed above, one of the fabrication processes incorporated herein by reference or some other fabrication process that results in layers being formed on previously formed layers and adhered thereto. After formation of the structure the process moves forward to element 154 which calls for the supplying of a heat treatment to the structure such that interlayer adhesion, for example, is enhanced. The heat treatment may be applied by a heating system such as that illustrated in FIG. 5, or it may be applied in a different manner. The heat treatment is applied at a temperature and for a time that results in a desired increase in interlayer adhesion.

Figure 7:
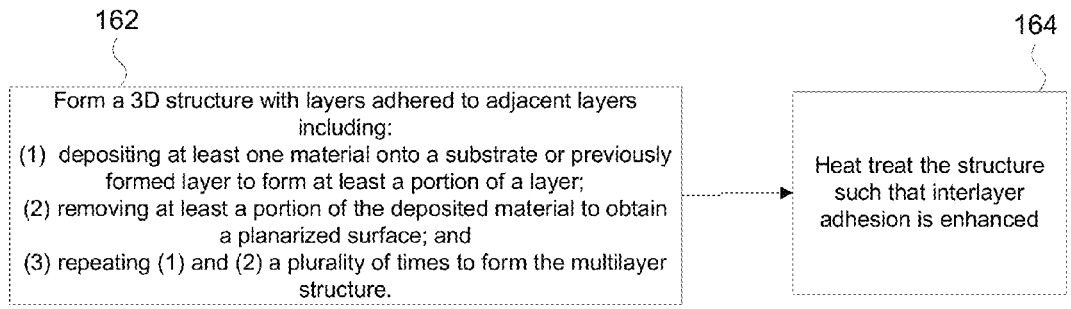
FIG. 7 depicts a block diagram of a second embodiment of the invention where the formation of a multilayer three-dimensional structure includes an operation to planarize deposited layers of material and wherein the structure is subjected to heat treatment after formation.

FIG. 7 depicts a block diagram of a second embodiment of the invention where the formation of a multilayer three-dimensional structure includes an operation to planarize deposited layers of material and wherein the structure is subjected to heat treatment after formation. Element 162 of FIG. 7 calls for the formation of a three-dimensional structure which includes a plurality of adhered layers. The formation process will include the depositing of at least one material onto a substrate or previously formed layer such that at least a portion of the layer is formed. Then at least a portion of the deposited material is removed to obtain a planarized surface that may form an outward facing portion of the structure or alternatively it may form a surface onto which additional material may be adhered. Planarization may occur for example by lapping, polishing, chemical mechanical polishing, milling, diamond fly cutting, or the like. After the depositing and removing of material to form a first layer or portion of a layer the depositing and removing steps are repeated to form additional layers of the structure which are adhered together. After the formation of the structure is complete, the process moves forward to element 164 which calls for the heat treating of the structure such that interlayer adhesion is enhanced.

Figure 8:
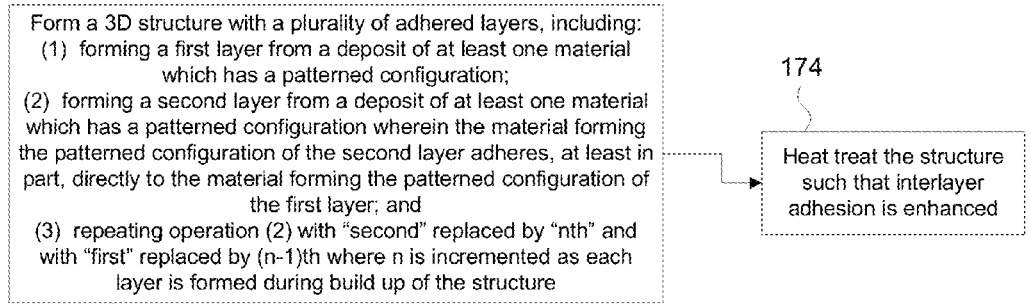
FIG. 8 depicts a block diagram of a third embodiment of the invention wherein the formation of a multi-layer structure includes adhered subsequently patterned layers of material directly to immediately preceding patterned layers of material and wherein the structure is subjected to heat treatment after formation.

FIG. 8 depicts a block diagram of a third embodiment of the invention wherein the formation of a multi-layer structure includes subsequently patterned layers of material that are adhered directly to immediately preceding patterned layers of material and wherein the structure is subjected to heat treatment after formation. Element 172 of FIG. 8 calls for the formation of a three-dimensional structure from a plurality of adhered layers. The first operation involves the forming of a first layer from a deposit of at least one material where the material has a patterned configuration. The material may be deposited in a patterned manner or it may be deposited in a blanket fashion where patterning occurs after deposition. The formation of the first layer may include the deposition of a second material or further materials, it may also include removal operations for the purpose of patterning or the purpose of planarization, and/or it may also include other operations such as cleaning operations, activation operations, process monitoring operations, and the like. After the first layer is formed, a second layer is formed from the deposit of at least one material which has a patterned configuration. The patterned material deposited to form the second layer adheres, at least in part, directly to the patterned configuration of material forming the first layer. In other words, there is no unpatterned intervening material that separates the first and second layers. In the formation of the structure a third operation involves the repeating the second operation as necessary to build up the structure from the plurality of layers. During the repetition "second" is replaced by "$n^{th}$" and "first" is replaced by "$(n-1)^{th}$" where n is increment from 3 to N, where N is the number of the last layer to be formed. After formation of the structure is complete, the process moves forward to element 174 which calls for a heat treatment of the structure such that interlayer adhesion is enhanced.

Figure 9:
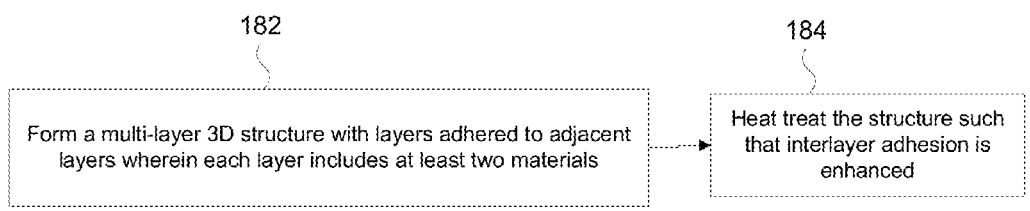
FIG. 9 depicts a block diagram of a fourth embodiment of the invention wherein the formation of a multi-layer structure includes the deposition of a plurality of materials during the formation of each layer and wherein the structure is subjected to heat treatment after formation.

FIG. 9 depicts a block diagram of a fourth embodiment of the invention wherein the formation of a multi-layer structure includes the deposition of a plurality of materials during the formation of each layer and wherein the structure is subjected to heat treatment after formation. Element 182 calls for the formation of a multi-layer structure where the layers are adhered to adjacent layers and wherein each layer includes at least two deposited materials. Each of the materials may be structural material or alternatively at least one of the materials may be a structural material and at least one of the other materials may be a sacrificial material. After the structure is formed the process moves forward to element 184 which calls for heat treating the structure such that interlayer adhesion is enhanced.

Figure 10:
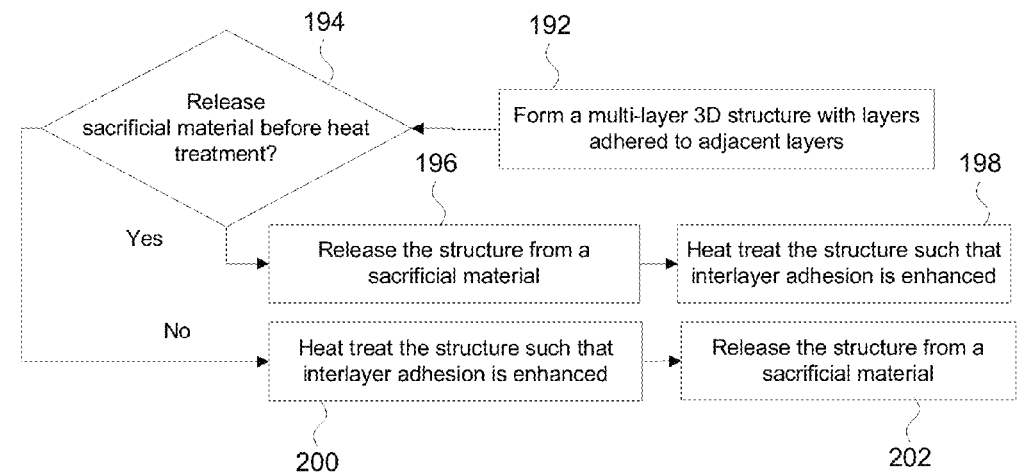
FIG. 10 depicts a flowchart of a fifth embodiment of the invention which may be considered an expanded version of the fourth embodiment wherein one of the materials is a sacrificial material and may be removed either before or after heat treatment.

FIG. 10 depicts a flowchart of a fifth embodiment of the invention which may be considered an expanded version of the fourth embodiment where one of the materials is a sacrificial material and may be removed either before or after heat treatment. The process of FIG. 10 begins with element 192 which calls for the formation of a multi-layer three-dimensional structure wherein adjacent layers are adhered to one another and where the structure includes at least one structural material and where at least one or more layers includes a sacrificial material.

After the structure is formed, the process moves forward to element 194 which makes an inquiry as to whether the sacrificial material is to be released from the structural material prior to heat treatment. If the answer is "yes", the process moves forward to element 196 which calls for the release of the structure from the sacrificial material, for example, via a chemical etching operation or the like. After which the process moves forward to element 200 which calls for heat treating the structure such that interlayer adhesion is enhanced. If the answer to the inquiry of element 194 is "no", the process moves forward to element 200 which calls for the heat treating of the structure such that interlayer adhesion is enhanced and thereafter the process moves forward to element 202 which calls for the release of the structure from the sacrificial material. In some embodiments, it may be desirable to release the structure from the sacrificial material prior to heat treating as the presence of the sacrificial material during heat treating may cause undesired alloying between a sacrificial material and a structural material or it may cause creation of undesired inter-metallic compounds at the interface between the two materials. However, in other embodiments alloying and/or formation of inter-metallic compounds may give desirable benefits. It may also be desirable to cause the release prior to heat treatment since some structural materials and sacrificial materials may have significantly different coefficients of thermal expansion that could result in undesirable stresses being introduced into the structure during heat treating if the sacrificial material were present and if the heat treating temperature is high. In other embodiments it may be desirable to have the sacrificial material present at the time of heat treatment of the structure, as the sacrificial material may form a mold that will help hold the structural material in its proper position during treatment.

Figure 11:
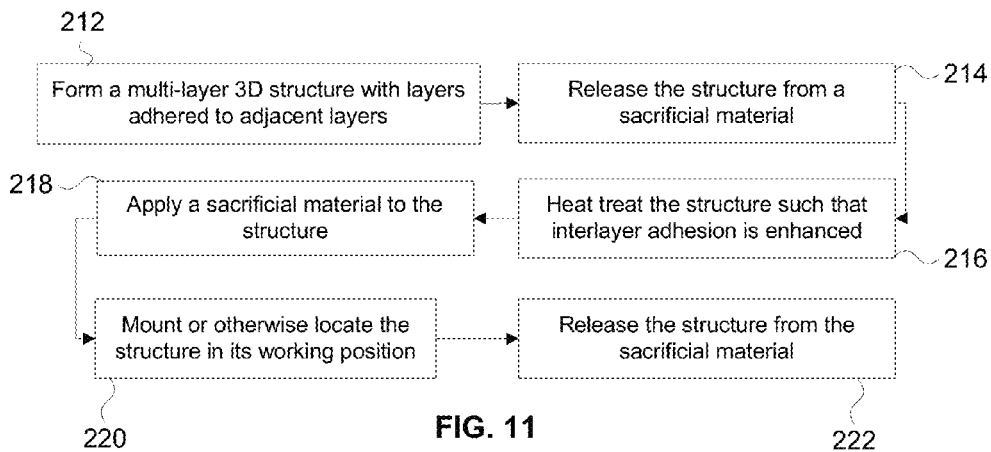
FIG. 11 depicts a block diagram of a sixth embodiment of the invention where a structure is separated from a sacrificial material for heat treatment but is at least in part encapsulated with a sacrificial material after heat treatment untill it is ready to use or is put to use at which time the sacrificial material may be removed.

FIG. 11 depicts a block diagram of a sixth embodiment of the invention where a structure is separated from a sacrificial material before heat treatment but is at least in part encapsulated with a sacrificial material after heat treatment until it is ready to use or is put to use at which time the sacrificial material may be removed. The process of FIG. 11 begins with element 212 which calls for the formation of a multi-layer 3-dimensional structure where adjacent layers are adhered to one another. After the structure is formed, the process moves forward to element 214 which calls for the release of the structure from at least one sacrificial material. Thereafter the process moves forward to element 216 which calls for the heat treating of the structure such that interlayer adhesion is enhanced. After heat treatment is completed the process moves forward to element 218 which calls for the applying of a sacrificial material to the structure. This sacrificial material may be the same as a sacrificial material used during the formation of the structure, or it may be a different sacrificial material. For example, if the structural material is nickel, this sacrificial material may be copper. Alternatively it may be a photoresist material, a photopolymer, or some other material that may be applied to the structure in a liquid state and then separated from the structure via chemical dissolution, melting, or the like. This applied sacrificial material may be useful in protecting a delicate microstructure during a handling, shipping, mounting or during other processes to which the fragile structure may be subject. After the sacrificial material is applied the process moves forward to element 220 which calls for the mounting or otherwise locating of the structure into a working position after which the process moves forward to element 222 which calls for the release of the structure from the applied sacrificial material.

In some alternative embodiments the sacrificial material that is applied after heat treatment may remain in place during use of the microstructure. For example such retention of the sacrificial material may be useful in an RF application where the sacrificial material may be a dielectric that helps support portions of coaxial structures and the like. In other embodiments, more than one sacrificial material may be used during formation of the structure, at least one of the materials may be removed prior to heat treatment and at least one of the materials may remain during heat treatment, a portion of the remaining sacrificial material may interact with the structural material during heat treatment for a beneficial purpose, and then after heat treatment at least a portion of this retained sacrificial material may be removed. Alternatively, the sacrificial material may be removed prior to heat treatment and another material added prior to heat treatment, heat treatment may occur with this extra-material in place, and then after heat treatment the added material may be retained in whole or in part, or it may be removed in its entirety.

Figure 12:
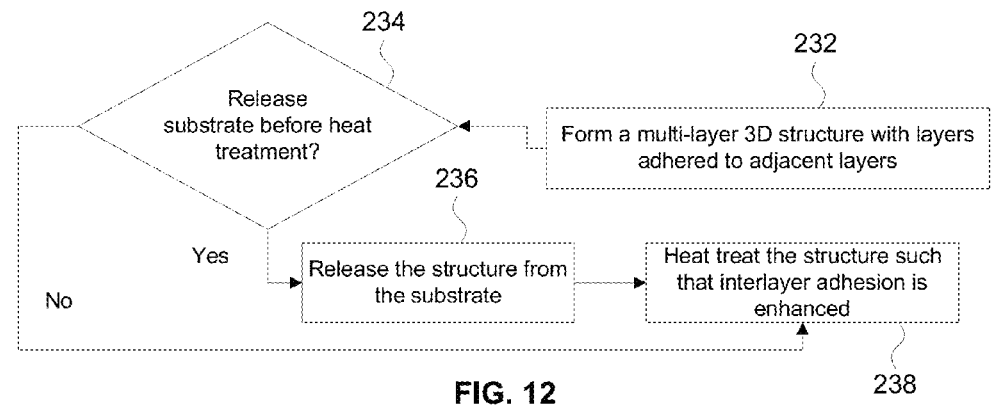
FIG. 12 depicts a flowchart of a seventh embodiment of the invention wherein the structure may or may not be released from a substrate prior to heat treatment.

FIG. 12 depicts a flowchart of a seventh embodiment of the invention wherein the structure may or may not be released from a substrate prior to heat treatment. In this embodiment it is recognized that it may be desirable to release a structure from its substrate prior to performing a heat treatment operation. This may be desirable, for example, when the structure is formed from a material which has a significantly different coefficient of thermal expansion from that of the substrate material. After heat treatment the structure could then be attached to a different substrate or even potentially reattached to the initial substrate.

The process of this embodiment begins with element 232 which calls for the formation of a multi-layer three-dimensional structure that has layers adhered to one another. After formation of the structure the process moves forward to element 234 which inquires as to whether the structure should be released from the substrate prior to heat treatment. If the answer is "yes", the process moves forward to element 236 which calls for the release of the structure from the substrate. This release may occur, for example, via a meltable or dissolvable release layer that is located between the substrate and the structure. Alternatively, it may occur by machining away the substrate and/or etching and/or planarizing away the substrate or a remaining portion of the substrate. After release of the structure from the substrate, the process moves forward to element 238 which calls for the heat treating of the structure such that interlayer adhesion is enhanced. If the inquiry in element 234 produced a negative response, the process would simply move forward from element 234 to the heat treating operation of element 238.

Figure 13:
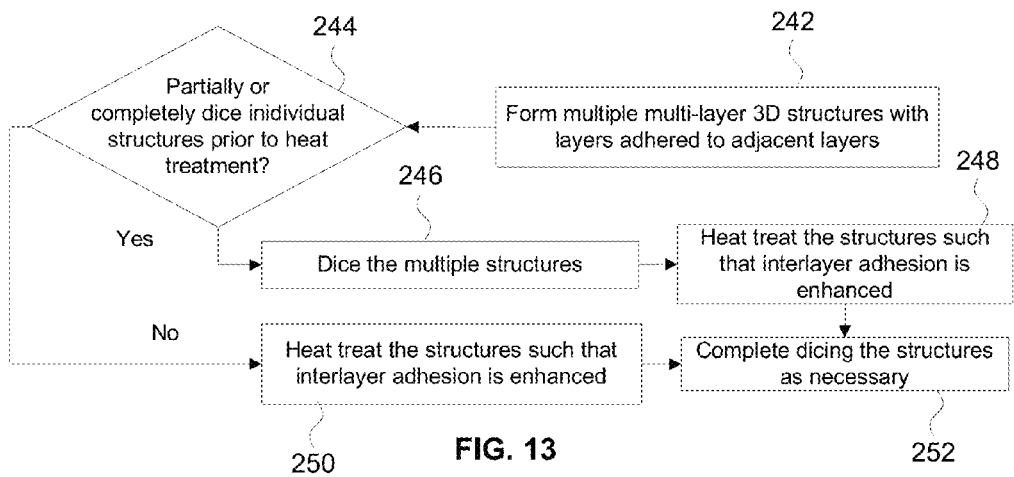
FIG. 13 depicts a flow chart of an eighth embodiment of the invention wherein multiple multi-layer structures are formed which may be partially or completed diced from one another prior to heat treatment.

FIG. 13 depicts a flowchart of an eighth embodiment of the invention wherein multiple multi-layer structures are formed which may be partially or completed diced from one another prior to heat treatment. The process of this embodiment begins with element 242 which calls for the formation of multiple multi-layer structures. After formation of the multi-layer structures, the process moves forward to element 244 which inquires as to whether partial or complete dicing of individual structures should occur prior to heat treatment. In some circumstances it may be desirable to partially or completely cut through sacrificial material that may be located between adjacent die (i.e. individual structures or sets of structures) prior to heat treatment so that stress build ups that might result from differentials in coefficients of thermal expansion cannot propagate from relatively small individual die regions across die boundaries to distal regions where they may reach magnitudes that are capable of causing undesired distortions, delaminations, and the like.

If inquiry 244 produces a "yes" response, the process moves forward to element 246 which calls for the dicing of the multiple structures. Thereafter the process moves forward to block 248 which calls for the heat treatment of the structures such that interlayer adhesion is enhanced. After the operation of element 248, the process may move forward to element 252 which will be discussed shortly.

If inquiry 244 produces a "no" response, the process moves forward to element 250 which calls for the heat treating of the structures such that interlayer adhesion is enhanced and thereafter the process moves forward to element 252 which calls for the dicing of the structures. As noted above, from element 248 the process may also move forward to element 252 if dicing of element 246 was incomplete and if a supplemental dicing is beneficial to complete the separation process.

Figure 14:
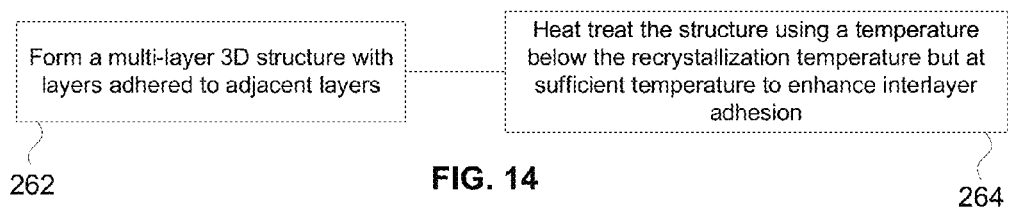
FIG. 14 depicts a block diagram of a ninth embodiment of the invention where the structure is heat treated, after formation, at a temperature that is less than a recrystallization temperature of at least one of the structural materials from which the structure is formed.

FIG. 14 depicts a block diagram of a ninth embodiment of the invention where the structure is heat treated, after formation, at a temperature that is less than a recrystallization temperature of at least one of the structural materials from which the structure is formed. The process for this embodiment starts with element 262 which calls for the formation of a multi-layer structure where adjacent layers are adhered to each other. After formation of the structure, the process moves forward to element 264 which calls for heat treating the structure using a temperature that is below the re-crystallization temperature of the structural material but is also sufficiently high and applied for a sufficient time such that enhanced interlayer adhesion results.

This embodiment can be illustrated with some experimental results. In one set of experiments, adhesion tests were performed on electrodeposited samples of nickel that were formed on a nickel substrate. Adhesion tests were also performed on similarly prepared samples that underwent a heat treatment at about 450° C. for 5 to 9 hours. Prior to performing the electroplating of the nickel, for all samples, the surface of the nickel substrate was treated using an activator known as C-12 Activator from Puma Chemical of Warne, N.C. The activation process followed the recommendations of the manufacturer. The three samples that did not undergo heat treatment showed adhesion failures at about 44, 53, and 68 MPa. Three samples that underwent heat treatment showed adhesion failures at about 153, 215, and 280 MPa. In other words, in this experiment, adhesion improved by a factor of about 2.2 to a factor of about 6.4 with the average being about a factor of 4.0.

Figure 22A:
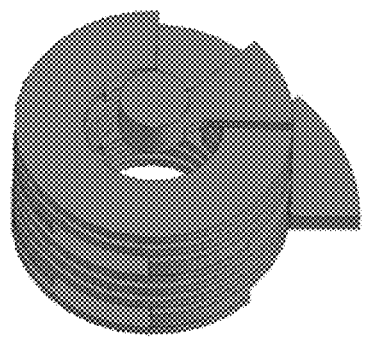
FIGS. 22A-22C depict various views of the CAD design of a helical spring-type contact element.
Figure 22B:
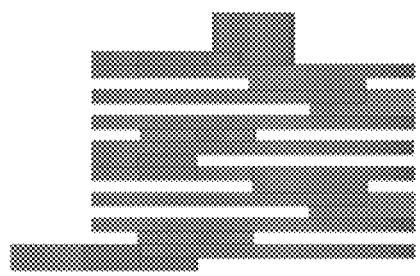
Figure 22C:
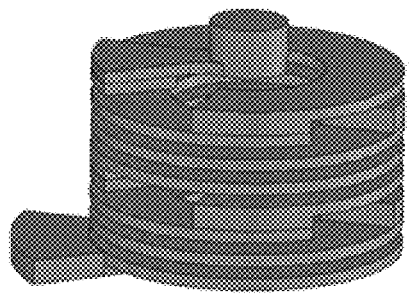
Figure 22D:
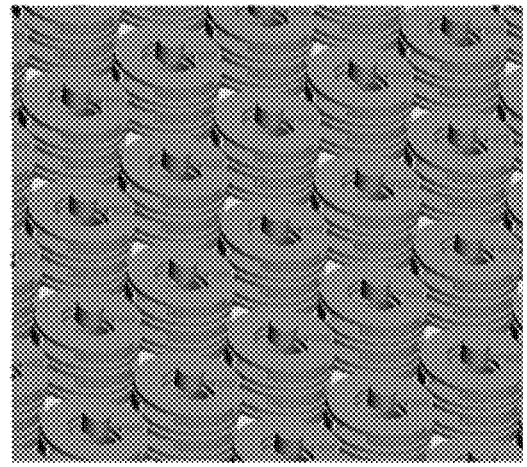
FIG. 22D depicts a number of helical spring-type contact elements of FIGS. 22A-22C which are to be formed together in an array.
Figure 22E:
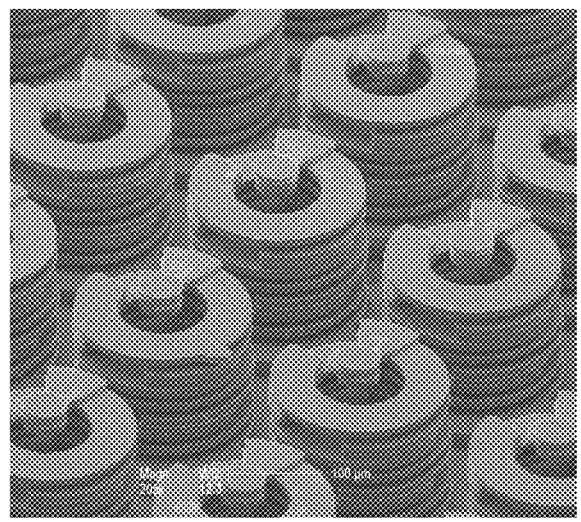
FIG. 22E depicts an SEM image of the microstructures of FIG. 22D created using an electrochemical fabrication process.

In another experiment, numerous helical structures like those shown in FIGS. 22A-22E were formed. FIGS. 22A-22C depict various views of the CAD design of a helical spring-type contact element. In this design the thickness of each layer is 8 microns, the width of which helical element is 80 microns, the diameter of the overall helical element (excluding the base element) is 200 microns, and the overall height is 160 microns. FIG. 22D depicts a number of helical spring-type contact elements of FIGS. 22A-22C which are to be formed together in an array. FIG. 22E depicts an SEM image of the microstructures of FIG. 22D created using an electrochemical fabrication process.

Some elements of an array like that of FIG. 22E were subjected to a tensile pulling test to determine the viability of interlayer adhesion. Some samples that were pulled underwent a heat treatment while others did not. Four of the un-heat treated samples (each initially 160 microns in height were pulled and each experienced interlayer adhesion failure at between 100 and 300 microns of extension. Heat treated samples that were pulled and were extended to a height of more than 2 millimeters and no delamination was observed. The heat treatment for these samples included raising the samples to a temperature of 500° C. at a rate of less than or equal to about 3° C. per minute and then holding the 500° C. temperature for 15 minutes and then cooling down the samples at a rate of less than or equal to about 10° C. per minute. This heat treating process was performed with the structure in a forming gas which included about 5% H2 and about 95% N2.

Figure 23:
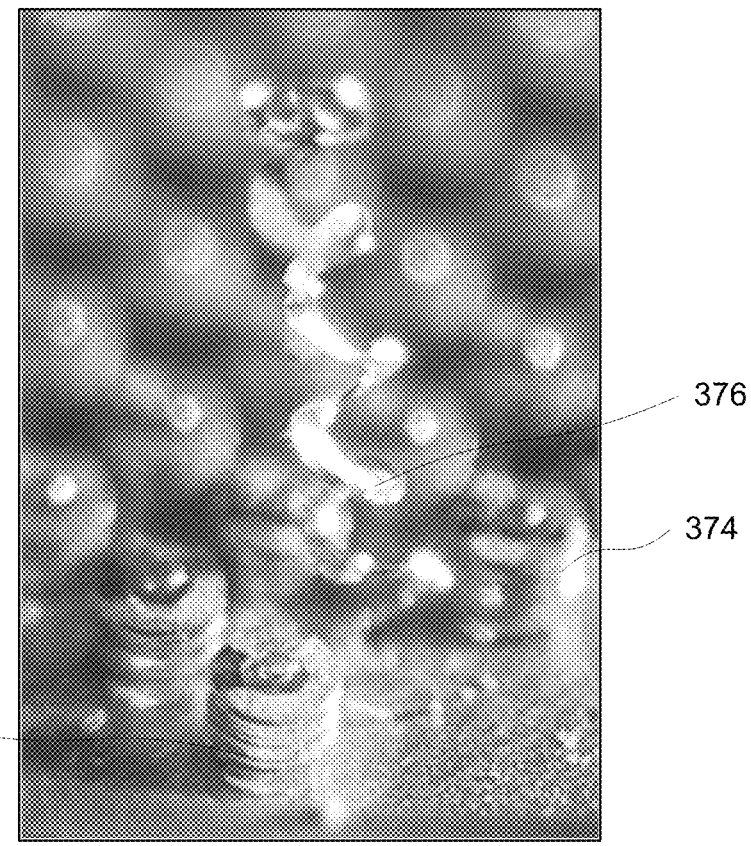
FIG. 23 depicts a substrate containing a plurality of devices similar to those shown in FIG. 22B which have been heat treated and wherein one of the devices has been subjected to a tensional force that has stretched the structure beyond the elastic limits of the material wherein the structure behaved monolithically (i.e. adhesion at the layer boundary did not fail).

FIG. 23 illustrates numerous un-pulled heat treated structures such as structures 372 and 374 along with one pulled structure 376 which illustrates that the structure was pulled beyond the elastic limit of the material (i.e. into the plastic deformation region) and that the adhesion strength was greater than the yield strength of the structure (i.e. the stress and associated strain at which elastic deformation gives way to plastic deformation). Not only did these heat treated samples yield a significant improvement in interlayer adhesion, it is also believed that a significant decrease in interlayer electrical resistance occurred. In these experiments, heat treatment of the samples was performed after release of the nickel structures from a copper sacrificial material.

It is believed that a dwell temperature (Td), i.e. a maximum temperature of heating, of between 250° C. and 350° C. could be used to achieve significant improvements in interlayer adhesion particularly if the dwell time is appropriately increased. It is also believed that heat treating at somewhat lower temperatures, e.g. 150° C. to 200° C. may also produce useful results. However, when working with nickel structures it is believed that a dwell temperature in the range of 350° C. to 550° C., or somewhat higher, would allow a more timely improvement in interlayer adhesion. It is believed that in some embodiments the dwell time (i.e. a time at the maximum temperature) of less than 5 minutes could be used to achieve acceptable results. While in other embodiments a dwell time in the range of 5 minutes to 60 minutes or even longer may be necessary or preferable. Lower dwell temperatures and longer dwell times may be particularly beneficial when a portion of the structure or the substrate on which it is attached is susceptible to heat damage. It is believed that those of skill in the art can perform experiments to determine acceptable dwell temperatures and dwell times as well as determining reasonable heating and cooling rates. For example, heating rates in some embodiments may be set in the range of 3° C. to 10° C. per minute or even higher.

Though in the present embodiment the maximum heat treating temperature (i.e. dwell temperature) is intended to be below the re-crystallization temperature of the structural material, it is believed that in some embodiments, heat treating temperatures may exceed the re-crystallization temperatures.

For example, in some embodiments a preferred structural material might be nickel whereas in other embodiments preferred structural material might be copper. As nickel has a melting temperature of about 1455° C. and as the re-crystallization temperature of nickel is believed to be about ½ of the absolute melting temperature (i.e. about 590° C.) it is preferred to keep the heat treatment temperature below this 590° C. level. As the melting temperature of copper is about 1083° C. and as it is believed that the re-crystallization temperature of copper is about ⅓ of the absolute melting temperature (i.e. about 200° C.) preferred heat treating operations for copper structures may use maximum temperatures below this 200° C. value. In other embodiments, however, where other structural materials are used, or where nickel or copper alloys (e.g. nickel phosphor or nickel cobalt), or nickel or copper with different levels of impurities are used, different re-crystallization temperatures may exist and thus different maximum preferred heat treatment temperatures may exist. It is also understood that different deposition processes and/or metal working processes may yield different recrystallization temperatures for a given material and as such, different preferred ranges of heat treating temperatures may exist.

In applications where the structures, or components, formed are desired to be harder and less ductile, then heat treating below the re-crystallization temperature is preferred. However, in other applications where the structures or components are desired to be softer and/or more ductile, heat treating at a temperature above the re-crystallization temperature may be more preferred. Without limiting the scope of the applicants' invention, it is believed that the increase in adhesion strength and possible increase in intralayer cohesion may result from a phenomenon known as diffusion bonding which results in the transport of atoms across boundaries regions. It is also possible that another mechanism is, at least in part, responsible for the improvement in adhesion strength. This other mechanism may involve the reduction of metallic oxides that may exist at the interface between layers or at other locations within a structure.

In some alternative embodiments, it may be possible to heat treat a structure to improve interlayer adhesion and then after release and heat treatment, it may be possible to deposit a relatively uniform coating of material over the surface of the structures (e.g. by electroplating or the like) to improve the hardness and yield strength of the combined structures.

In other alternatives to the present embodiment, the forming gas may include $H_2$ in the range of about 1% to 10% or even higher. In still other embodiments the atmosphere may be substantially pure $H_2$, while in other embodiments other reducing gases or agents may be usable. In still other embodiments the atmosphere may be an inert gas such as $N_2$ or Ar. In still further embodiments the structures may be heat treated in a vacuum. When a gas is present during heat treatment, that gas may be held at a pressure below one atmosphere, at substantially one atmosphere, or at some elevated pressure. During heat treatment, gas may be present in a stagnant mode or it may be made to flow around the structure or structures (this may be implemented in the form of a fan that directs the gas around the chamber or in the form of a continuous flushing of gas through the chamber. In some embodiments, it may be desirable to locate a second structural material between adjacent layers of the first structural material. This intermediate material may have a melting temperature or a recrystallization temperature below that of the structural material and may be used to enhance diffusion bonding.

In some embodiments more than one structural material may exist in the structure or component, depending on the function of each material (e.g. to give strength, enhanced conductivity, or dielectric properties), it may be desirable to perform the heat treatment or diffusion bonding at a temperature which is below the lower of the two or more re-crystallization temperatures or below some intermediate re-crystallization temperature, or below the highest of the re-crystallization temperatures.

In some alternatives to the present embodiment, various techniques may be combined with the techniques explicitly presented herein. For example, it may be acceptable or desirable to perform the heat treatment operation with the sacrificial material still in place. In still other alternatives, heat treatment or diffusion bonding may be practiced on a partially released structure (i.e. a structure or component where some sacrificial material still remains). In some embodiments separate structures may be deliberately decoupled by introducing gaps between them so as to eliminate or minimize the propagation of stresses associated with differing coefficients of thermal expansion. In still other alternative embodiments, during heat treatment compressive, mechanical forces may be applied along a direction which is perpendicular to the plane of the layers.

In still other alternative embodiments heat treatment may be performed with the structure immersed in a liquid or in an environment where gas pressure or hydro-static pressure is greater than 10 to 50 PSI. In still other alternative embodiments heat treatment may be performed prior to the completion of formation of a structure. For example, it may be performed on a layer by layer basis or periodically after the formation of a desired number of layers.

Figure 15:
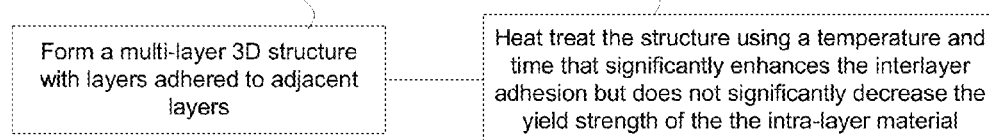
FIG. 15 depicts a block diagram of a tenth embodiment of the invention where the structure is heat treated after formation at a temperature that significantly enhances interlayer adhesion but does not significantly decrease the yield strength of the intra-layer material.

FIG. 15 depicts a block diagram of a tenth embodiment of the invention where the structure is heat treated after formation at a temperature that significantly enhances interlayer adhesion but does not significantly decrease the yield strength of the intra-layer material. This embodiment starts with element 272 which calls for formation of a multi-layer structure with layers that are adhered to one another. After formation of the structure this embodiment, proceeds to element 274 which calls for a heat treatment of the structure using a temperature and time that significantly enhances the interlayer adhesion but does not significantly decrease the yield strength of the intra-layer material.

Figure 16:
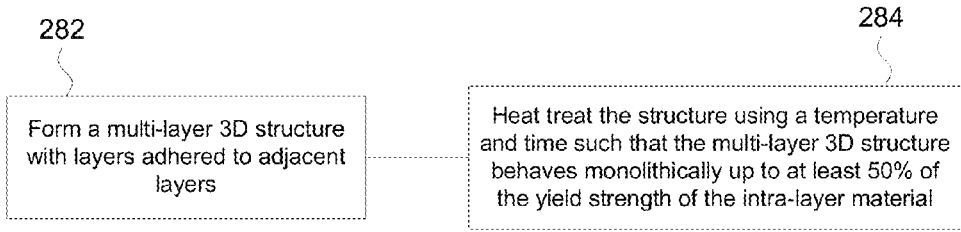
FIG. 16 depicts a block diagram of an eleventh embodiment of the invention where the structure is heat treated at a temperature and time such that the multi-layer structure behaves monolithically up to at least 50% of the yield strength of the intra-layer material forming the structure.

FIG. 16 depicts a block diagram of an eleventh embodiment of the invention. As with the other embodiments discussed so far, this embodiment starts with the formation of a multi-layer 3-dimensional structure where adjacent layers are adhered to one another. After formation of the structure, the structure is heat treated using a temperature and time such that the structure behaves monolithically up to at least 50% of the yield strength of the intra-layer material. In other words, interlayer adhesion does not fail at tension levels that are below 50% of the yield strength (i.e. the strength at which elastic deformation gives rise to plastic deformation). In some alternatives, the monolithic behavior extends through the full elastic deformation region while in even further embodiments it may extend substantially into the plastic deformation region.

Figure 17:
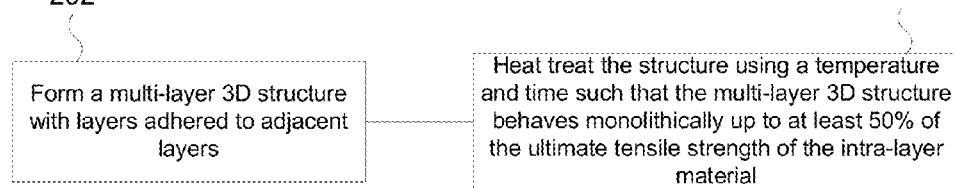
FIG. 17 depicts a block diagram of an twelfth embodiment of the invention where the structure is heat treated at a temperature and time such that the multi-layer structure behaves monolithically up to at least 50% of the ultimate tensile strength of the intra-layer material forming the structure.

FIG. 17 depicts a block diagram of an eleventh embodiment of the invention. This embodiment begins with element 292 which calls for a formation of a multi-layer structure where adjacent layers are adhered to one another. After formation of the structure, the process proceeds to element 294 which calls for heat treating the structure using a temperature and time such that a structure behaves monolithically up to at least 50% of the ultimate tensile strength of the intra-layer material. In other words, interlayer adhesion doesn't fail until tensional forces cause stress and strain in the interlayer region to exceed 50% of the ultimate tensile strength of the material forming the intra-layer portions of the structure. Ultimate tensile strength refers to the tensile stress, per unit of original surface area, at which a body will fracture, or continue to deform under a decreasing load. When intra-layer tensile strength or yield strength is referred to herein, applicants mean the tensile strength or yield strength, respectively, that a sample would have when it is formed as the material is formed that make up the layers without the existence of inter-layer boundaries.

Figure 18:
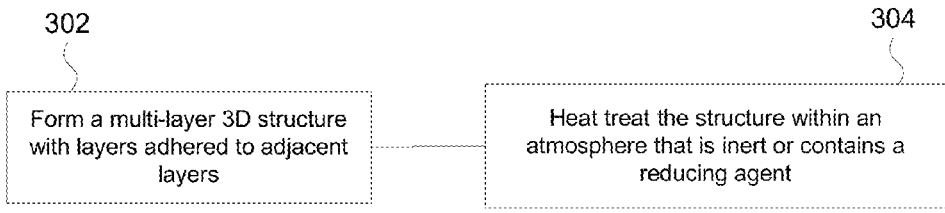
FIG. 18 depicts a block diagram of a thirteenth embodiment of the invention where the structure is heat treated in an atmosphere that is inert or that includes a reducing agent.

FIG. 18 depicts a block diagram of a thirteenth embodiment of the invention. In this embodiment of the invention the process begins with the formation of a multi-layer structure where adjacent layers are adhered to one another. After formation, the process moves forward to element 304 which calls for the heat treatment of the structure within an atmosphere that is either inert or contains a reducing agent. Inert atmospheres include such gaseous material as nitrogen ($N_2$), argon (Ar), neon (Ne), and krypton (Kr), and the like. Reducing agents include hydrogen gas ($H_2$), and the like, as well as gas mixtures that contain these agents such as forming gases. In some alternative embodiments, it may be possible to perform heat treatments in gases or under sprays of materials, for example, that are not inert or offer reducing properties but instead are chemically reactive with the structural material or materials that make up the structures. Such materials may include, for example, carbon containing compounds that may interact with the surfaces of the structures to yield new structural characteristics for the devices.

Figure 19:
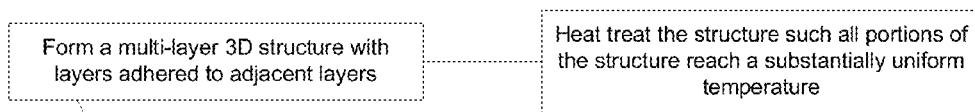
FIG. 19 depicts a block diagram of a fourteenth embodiment of the invention where the structure is heat treated such that all portions of the structure reach a substantially uniform temperature.

FIG. 19 depicts a block diagram of a fourteenth embodiment of the invention where the structure is heat treated such that all portions of the structure reach a substantially uniform temperature. In this embodiment the process begins with element 312 which calls for the formation of a multi-layer structure with adjacent layers that are adhered to one another. After formation, the process proceeds to element 314 which calls for heat treatment of a structure using a substantially uniform temperature. In other words, using a temperature that has substantially the same value in all portions of a structure. In these embodiments, for the temperature to be considered substantially uniform, the temperature variation throughout all regions of interest in a structure, during heat treatment, is preferably less than about 25° C., more preferably less than about 15° C., and most preferably less than about 5° C. Alternatively, the temperature variation across a structure is preferably less than about 10% of the target temperature in ° C., more preferably less than about 5% and even more preferably less than about 1%. At dwell temperature, the temperature of the structure is preferably controlled within less than about 10% of the target dwell temperature in ° C., more preferably within 5%, and even more preferably within 1%.

Figure 20:
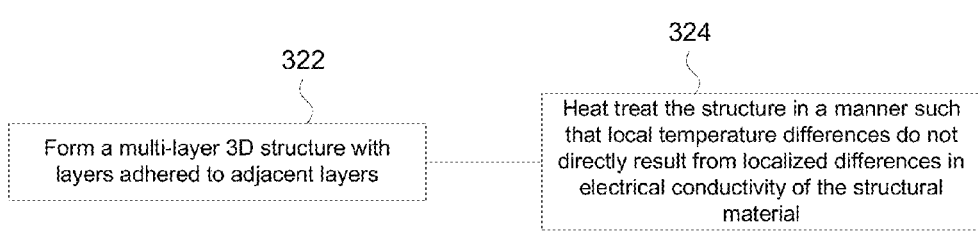
FIG. 20 depicts a block diagram of a fifteenth embodiment of the invention where the structure is heat treated such that local temperature differences do not directly result from localized differences in electrical conductivity (i.e. from ohmic heating from carrying an electric current).

FIG. 20 depicts a block diagram of a fifteenth embodiment of the invention where the structure is heat treated such that local temperature differences do not directly result from localized differences in electrical conductivity (e.g. do not result from variations in ohmic heating at different locations within a structure). In this embodiment of the invention, the process begins with the formation of the multi-layer structure where adjacent layers are adhered to one another. After formation, the process moves forward to element 324 which calls for the heat treatment of the structure in a manner such that local temperature differences do not directly result from localized differences in electrical conductivity of the structural material. In this embodiment heating of the structure preferably occurs by convective, conductive or radiative application of heat to the surface of the structure. In some alternative embodiments, heating may occur by passing a current through the devices but temperature variations across different regions of a structure that result from ohmic heating are preferably less than about 25° C., more preferably less than about 15° C., and most preferably less than about 5° C.

Figure 21:
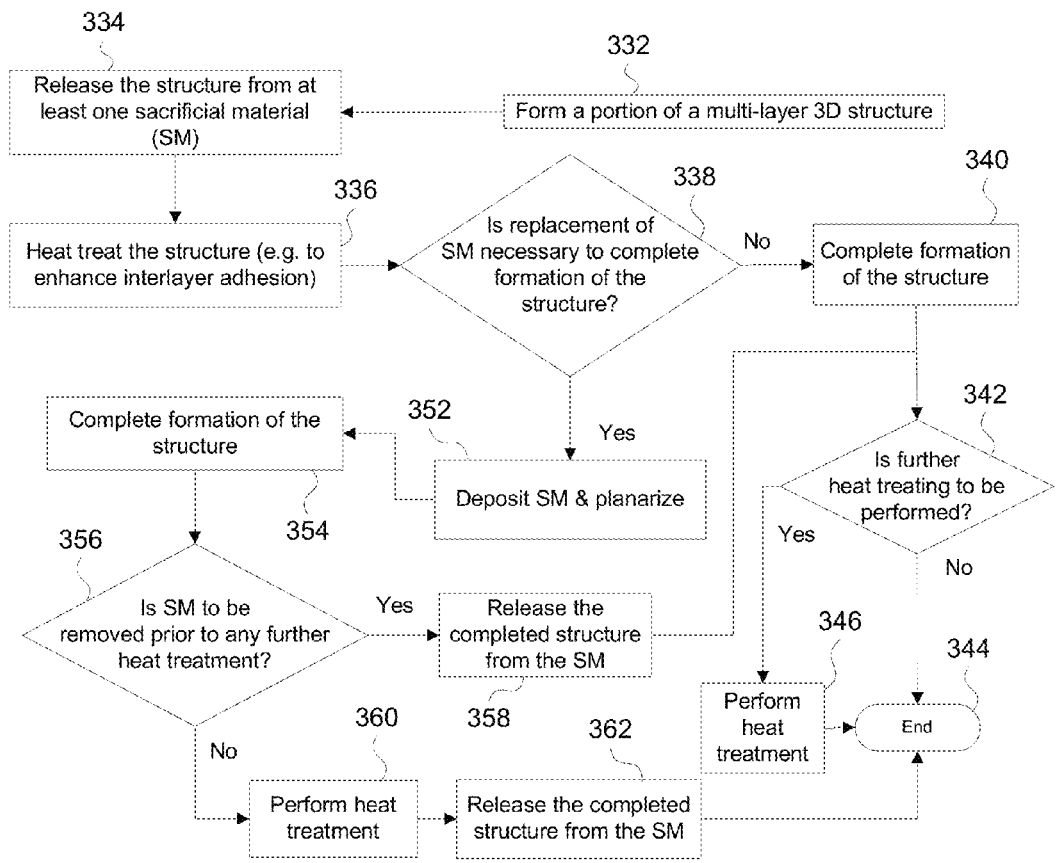
FIG. 21 depicts a flowchart of a sixteenth embodiment where the structure is partially formed, released from sacrificial material, then heat treated, and then completed with or without refilling of sacrificial material and with or without further heat treating.

FIG. 21 depicts a flowchart of a sixteenth embodiment where the structure is partially formed, released from sacrificial material, then heat treated, and then completed with or without refilling of sacrificial material and with or without further heat treating. In this embodiment of the invention, the process begins with formation of a portion of a multi-layer structure. After the portion of the multi-layer structure is formed, the process moves forward to element 334 which calls for the release of the multi-layer structure from at least one sacrificial material that was used during its formation of the portion of the structure. After removal of the sacrificial material, the process moves forward to element 336 which calls for heat treating the structure, for example, to enhance interlayer adhesion or to enhance adhesion to other elements which may be added to the structure. After heat treatment the process moves forward to element 338 which inquires as to whether replacement of the sacrificial material is necessary in order to complete formation of the structure. If the answer is "no" the process proceeds to element 340 which calls for completing formation of the structure after which the process moves forward to element 342 which inquires as to whether additional heat treating is to be performed, if the answer is "no" the process moves forward to element 344 and ends. If the answer to the inquiry of element 342 is "yes", the process moves forward to element 346 which calls for the performance of further heat treating and then moves forward to element 344 and ends.

If the answer to the inquiry of element 338 was "yes", the process moves forward to element 352 which calls for the deposition of sacrificial material and the potential planarization of that material in preparation for forming additional layers of the structure. From element 352, the process moves forward to element 354 which calls for the completion of the formation of the structure. After the structure is completed, the process moves forward to element 356 which inquires as to whether or not the sacrificial material is to be removed prior to any further heat treatment. If the answer is "yes", the process moves forward to element 358 which calls for the release of the completed structure from the sacrificial material after which the process moves to element 342 (which was discussed above) and either moves immediately to the end of the process at element 344 or proceeds to the heating treating called for by element 346 and then ends at element 344.

If the answer to the inquiry of element 356 is "no" the process moves forward to element 360 which calls for the performance of additional heat treatment after which the process moves forward to element 362 which calls for the release of the completed structure from the sacrificial material. Thereafter, the process moves on to element 344 and ends. This embodiment represents one of many possible combinations of the previously discussed embodiments and is intended to be an example of how such combinations may be made. Alternative embodiments may allow more than two releases of the partially formed structures and more than two heat treatments.

A seventeenth embodiment of the invention provides a low temperature process for heat treating a structure that has been electrochemically fabricated (e.g. a nickel structure). The process leads to improved interlayer adhesion with less loss of mechanical strength than that which may result from higher temperature processing. The primary operations of the process include:

1. Clean all released structures (i.e. structures which have been separated from the sacrificial material used during their formation) to remove organics and oxides by using a solvent and dilute acid rinses
2. Place the structures in an environmental chamber that provides for controlled temperature and atmosphere surrounding the structures.
3. Replace the chamber atmosphere with forming gas (e.g. having 5% hydrogen and 95% nitrogen).
4. Close all openings to the chamber and maintain a positive pressure of forming gas inside the chamber.
5. Ramp the temperature in the chamber from room temperature to 250° C. at a ramp rate of 10 degrees/minute. Monitor actual chamber temperature so that it does not exceed the current set point temperature by more than about 5° C. during at each time interval and particularly during the dwell period at maximum temperature. Keep a flow of forming gas going into the chamber throughout the ramp up and dwell periods
6. Hold the temperature the dwell temperature (i.e. maximum temperature) for 30 minutes (i.e. a dwell time)
7. Once dwell time ends, step down chamber temperature to room temperature by allowing chamber to cool naturally and while continuing the flow of forming gas for the first 30 minutes of cool down period. After 30 minutes, the temperature should be below 200° C. and the forming gas flow may be shut off.
8. Allow cooling to continue for another 30 minutes at which point the temperature should be around 160° C. or less.
9. At this point, open chamber door and allow for convection cooling with the room air. Allow cooling to continue for another 30 minutes. After this time, the temperature should be below 100° C.
10. Remove the structures from the chamber and cool the wafer or individual dies (if already diced) on chill plate by placing the sample on a metal and allowing the temperatures to equalize.

Experiments were performed using the process of embodiment seventeen. These experiments used a nickel structural material and produced significantly improved interlayer adhesion and less overall loss of strength of the heated structures (when compared to structures treated at higher temperatures). Inter-layer bonding was enhanced so that interlayer adhesion did not fail during the elastic compressions of the structures and higher overall strength was retained (i.e. higher force needed to yield a given deflection). Various alternatives to the seventeenth embodiment are possible. For example, a lower dwell temperature may be possible (e.g. 200, 150, or even 100 degrees C.); longer or shorter ramp up times and associated rates are possible, variations in the cool down process are possible, use of different gas environments during heating or cool down are possible (nitrogen only, hydrogen only, other ratios of nitrogen and hydrogen, use of inert gases such as argon, and the like); heat treatment before or after dicing; heat treatment before or after release; heat treatment before or after substrate swapping, and the like. It will be within the abilities of those of skill in art to perform basic experiments and to determine appropriate or even optimal parameters for heat treating various build and sacrificial materials.

Those of skill in the art will understand how to combine the various previously presented embodiments to form more elaborate and/or alternative embodiments. The combined embodiments may take a single aspect from two embodiments and combine them into a single embodiment or they may take various aspects from more than two embodiments and combine them.

It will be understood by those of skill in the art or will be readily ascertainable by them that various additional operations may be added to the processes set forth herein. For example, between performances of the various deposition operations, performance of any etching operations, and performance of various planarization operations cleaning operations, activation operations, and the like may be desirable.

The patent applications and patents set forth below are hereby incorporated by reference herein as if set forth in full. The teachings in these incorporated applications can be combined with the teachings of the instant application in many ways: For example, enhanced methods of producing structures may be derived from some combinations of teachings, enhanced structures may be obtainable, enhanced apparatus may be derived, and the like.

| US Pat App No.-Filing Date<br>US App Pub No.-, Pub Date<br>US Pat No.-Pub Date | Inventor, Title |
|---|---|
| 10/677,556-Oct. 1, 2003<br>2004-0134772-Jul. 15, 2004<br>— | Cohen, "Monolithic Structures Including Alignment and/or Retention Fixtures for Accepting Components" |
| 10/830,262-Apr. 21, 2004<br>2004-0251142-Dec. 16, 2004<br>7,198,704-Apr. 3, 2007 | Cohen, "Methods of Reducing Interlayer Discontinuities in Electrochemically Fabricated Three-Dimensional Structures" |
| 10/841,300-May 7, 2004<br>2005-0032375-Feb. 10, 2005<br>— | Lockard, "Methods for Electrochemically Fabricating Structures Using Adhered Masks, Incorporating Dielectric Sheets, and/or Seed layers That Are Partially Removed Via Planarization" |
| 10/271,574-Oct. 15, 2002<br>2003-0127336A-Jul. 10, 2003<br>7,288,178-Oct. 30, 2007 | Cohen, "Methods of and Apparatus for Making High Aspect Ratio Microelectromechanical Structures" |
| 10/697,597-Dec. 20, 2002<br>2004-0146650-Jul. 29, 2004<br>— | Lockard, "EFAB Methods and Apparatus Including Spray Metal or Powder Coating Processes" |
| 10/677,498-Oct. 1, 2003<br>2004-0134788-Jul. 15, 2004<br>7,235,166-Jun. 26, 2007 | Cohen, "Multi-cell Masks and Methods and Apparatus for Using Such Masks To Form Three-Dimensional Structures" |
| 10/724,513-Nov. 26, 2003<br>2004-0147124-Jul. 29, 2004<br>7,368,044-May 6, 2008 | Cohen, "Non-Conformable Masks and Methods and Apparatus for Forming Three-Dimensional Structures" |
| 10/607,931-Jun. 27, 2003<br>2004-0140862-Jul. 22, 2004<br>7,239,219-Jul. 3, 2007 | Brown, "Miniature RF and Microwave Components and Methods for Fabricating Such Components" |
| 10/387,958-Mar. 13, 2003<br>2003-0221968-Dec. 4, 2003<br>— | Cohen, "Electrochemical Fabrication Method and Application for Producing Three-Dimensional Structures Having Improved Surface Finish" |
| 10/434,494-May 7, 2003<br>2004-0000489A-Jan. 1, 2004<br>— | Zhang, "Methods and Apparatus for Monitoring Deposition Quality During Conformable Contact Mask Plating Operations" |
| 1/434,289-May 7, 2003<br>20040065555A-Apr. 8, 2004<br>— | Zhang, "Conformable Contact Masking Methods and Apparatus Utilizing In Situ Cathodic Activation of a Substrate" |
| 10/434,294-May 7, 2003<br>2004-0065550A-Apr. 8, 2004<br>— | Zhang, "Electrochemical Fabrication Methods With Enhanced Post Deposition Processing Enhanced Post Deposition Processing" |
| 10/434,295-May 7, 2003<br>2004-0004001A-Jan. 8, 2004<br>— | Cohen, "Method of and Apparatus for Forming Three-Dimensional Structures Integral With Semiconductor Based Circuitry" |
| 10/434,315-May 7, 2003<br>2003-0234179 A-Dec. 25, 2003<br>7,229,542-Jun. 12, 2007 | Bang, "Methods of and Apparatus for Molding Structures Using Sacrificial Metal Patterns" |
| 10/841,006-May 7, 2004<br>2005-0067292-Mar. 31, 2005<br>— | Thompson, "Electrochemically Fabricated Structures Having Dielectric or Active Bases and Methods of and Apparatus for Producing Such Structures" |
| 10/724,515-Nov. 26, 2003<br>2004-0182716-Sep. 23, 2004<br>7,291,254-Nov. 6, 2007 | Cohen, "Method for Electrochemically Forming Structures Including Non-Parallel Mating of Contact Masks and Substrates" |
| 10/841,347-May 7, 2004<br>2005-0072681-Apr. 7, 2005<br>— | Cohen, "Multi-step Release Method for Electrochemically Fabricated Structures" |
| 60/533,947-Dec. 31, 2003 | Kumar, "Probe Arrays and Method for Making" |

| US Pat App No.-Filing Date | | |
|---|---|---|
| US App Pub No.-, Pub Date | | |
| US Pat No.-Pub Date | Inventor, Title | |
| — | | |
| — | | |

Various other embodiments exist. Some of these embodiments may be based on a combination of the teachings herein with various teachings incorporated herein by reference. Some embodiments may not use any blanket deposition process and/or they may not use a planarization process. Some embodiments may use selective or blanket depositions processes that are not electrodeposition processes. Some embodiments may use one or more structural materials (e.g. nickel, gold, copper, silver, or the like). Some processes may use one or more sacrificial materials (e.g. copper, silver, tin, zinc, or the like). Some embodiments may remove a sacrificial material while other embodiments may not.

In view of the teachings herein, many further embodiments, alternatives in design and uses are possible and will be apparent to those of skill in the art. As such, it is not intended that the invention be limited to the particular illustrative embodiments, alternatives, and uses described above but instead that it be solely limited by the claims presented hereafter.

We claim:

1. A fabrication process for forming a plurality of multi-layer three-dimensional structures, comprising:
   (a) providing a substrate;
   (b) forming and adhering a first multi-material layer to a substrate, wherein the first multi-material layer comprises a desired pattern of at least one structural metal and at least one sacrificial metal;
   (c) forming and adhering a subsequent multi-material layer to a previously formed layer, wherein the forming and adhering of the subsequent multi-material layer comprises:
      a. selectively depositing at least one first metal using an adhered photoresist mask and thereafter removing the mask;
      b. depositing at least one second metal after removal of the mask; and
      c. planarizing the at least one first metal and the at least one second metal of the subsequent multi-material layer to set a boundary level for the subsequent multi-material layer, wherein the at least one first metal and the at least one second metal comprise at least one structural material and at least one sacrificial material;
   (d) repeating the forming and adhering operations of (b) and (c) at least once to build up a plurality of three-dimensional structures from a plurality of adhered multi-material layers;
   (e) after the forming of the plurality of adhered layers, releasing the plurality of three-dimensional structures from the at least one sacrificial material;
   (f) after formation of the plurality of adhered layers, subjecting the multi-layer structure to a heat treatment, wherein a maximum effective temperature during heat treatment is less than a recrystallization temperature of a selected one of the at least one structural material and is in a range of 150° C.-350° C., and wherein the heat treatment is applied for a sufficient time, at a sufficient temperature, and in an environment that results in average interlayer adhesion strength of the selected one of the at least one structural material exceeding one half of the average intra-layer yield strength of the selected one structural material after heat treatment.

2. The process of claim 1 wherein an average interlayer adhesion strength after the heat treatment is increased by at least a factor of two over the average interlayer adhesion strength prior to heat treatment.

3. The process of claim 1 wherein an average interlayer adhesion strength after the heat treatment is increased by at least a factor of five over the average interlayer adhesion strength prior to heat treatment.

4. The process of claim 1 wherein an average interlayer adhesion strength of the selected one of the at least one structural material after heat treatment is no less than the average intra-layer yield strength of the selected one of the at least one structural material after heat treatment.

5. The process of claim 1 wherein an average intra-layer adhesion strength of the selected one of the at least one structural material after heat treatment is at least as large as 75% of the average intra-layer yield strength of the selected one of the at least one structural material prior to heat treatment.

6. The process of claim 1 wherein an average interlayer adhesion strength of the selected one of the at least one structural material after heat treatment is no less than 50% of the ultimate tensile strength of the intra-layer material.

7. The process of claim 1 wherein any reduction in average intra-layer yield strength after heat treatment compared to before heat treatment is no more than 50% of an average intra-layer yield strength prior to heat treatment.

8. The process of claim 1 wherein the maximum effective temperature during heat treatment is in the range of 200° C.-350° C.

9. The process of claim 1 wherein an average intra-layer yield strength after heat treatment is no less than 75% of an average intra-layer yield strength prior to heat treatment.

10. The process of claim 1 wherein the at least one structural material comprises a material selected from the group consisting of nickel, nickel cobalt, and nickel.

11. The process of claim 1 wherein the maximum effective temperature during heat treatment is in the range of 250° C.-350° C.

12. A fabrication process for forming a plurality of multi-layer three-dimensional structure, comprising:
   (a) providing a substrate;
   (b) forming and adhering a first multi-material layer to a substrate, wherein the first multi-material layer comprises a desired pattern of at least one structural metal and at least one sacrificial metal;
   (c) forming and adhering a subsequent multi-material layer to a previously formed layer, wherein the forming and adhering of the subsequent multi-material layer comprises
      a. selectively depositing at least one first metal using an adhered photoresist mask and thereafter removing the mask;

b. depositing at least one second metal after removal of the mask; and c. planarizing the at least one first metal and the at least one second metal of the subsequent multi-material layer to set a boundary level for the subsequent multi-material layer, wherein the at least one first metal and the at least one second metal comprise at least one structural material and at least one sacrificial material;

(d) repeating the forming and adhering operations of (b) and (c) at least once to build up a plurality of three-dimensional structures from a plurality of adhered multi-material layers;

(e) after the forming of the plurality of adhered layers, releasing the plurality of three-dimensional structures from the at least one sacrificial material;

(f) after formation of at least a plurality of layers, subjecting the multi-layer structure to a heat treatment, wherein a maximum effective temperature during heat treatment is less than a recrystallization temperature of a selected one of the at least one structural material and is in the range of 150° C.-350° C. and wherein the heat treatment is applied for a sufficient time, at a sufficient temperature, and in an environment that results in the formation of a structure which behaves monolithically up to at least the yield strength of the intra-layer material after heat treatment.

13. The process of claim 12 wherein the structures exhibit monolithic behavior up to the yield strength of the selected one of the at least one structural material after heat treatment.

14. The process of claim 12 wherein mechanical failure of the selected one of the at least one structural material is no more likely to occur due to interlayer adhesion failure than to intra-layer cohesion failure up through the elastic deformation range of the structures at heat treatment.

15. The process of claim 14 wherein a yield strength of the interlayer portions of the selected one of the at least one structural material after heat treatment is no less than 50% of the yield strength of the interlayer portions of the selected one of the at least one structural material before heat treatment.

16. The process of claim 15 wherein the no less than 50% is no less than 75%.

17. The process of claim 16 wherein a yield strength of the inter-layer portion of the selected one of the at least one structural material after heat treatment is greater than the yield strength of the inter-layer portions of the selected one of the at least one structural material prior to heat treatment.

18. The process of claim 16 wherein the selected one of the at least one structural material comprises a material selected from the group consisting of nickel, nickel cobalt, and nickel phosphor.

19. A fabrication process for forming a plurality of multi-layer three-dimensional structures, comprising:

(a) providing a substrate;

(b) forming and adhering a first multi-material layer to a substrate, wherein the first multi-material layer comprises a desired pattern of at least one structural metal and at least one sacrificial metal;

(c) forming and adhering a subsequent multi-material layer to a previously formed layer, wherein the forming and adhering of the subsequent multi-material layer comprises:

a. selectively depositing at least one first metal using an adhered photoresist mask and thereafter removing the mask;

b. depositing at least one second metal after removal of the mask; and c. planarizing the at least one first metal and the at least one second metal of the subsequent multi-material layer to set a boundary level for the subsequent multi-material layer, wherein the at least one first metal and the at least one second metal comprise at least one structural material and at least one sacrificial material;

(d) repeating the forming and adhering operations of (b) and (c) at least once to build up a plurality of three-dimensional structures from a plurality of adhered multi-material layers;

(e) after the forming of the plurality of adhered layers, releasing the plurality of three-dimensional structures from the at least one sacrificial material;

(f) after formation of the plurality of layers, subjecting the multi-layer structure to a heat treatment wherein a maximum effective temperature during heat treatment is less than a recrystallization temperature of a selected one of the at least one structural material and is in the range of 150° C.-350° C. and wherein the heat treatment is applied for a sufficient time, at a sufficient temperature, and in an environment that results in improved inter-layer adhesion after heat treatment such that the plurality of three-dimensional structures are no more likely to experience interlayer adhesion failure than intra-layer cohesion failure through an elastic deformation range of the structures (i.e. up to the beginning of the plastic deformation range of the structures) when under tension.

20. The process of claim 19 wherein the range is between 200° C.-350° C.

21. The process of claim 19 wherein the selected one of the at least one structural material is selected from the group consisting of nickel, nickel cobalt, and nickel phosphor.

22. A fabrication process for forming a plurality of multi-layer three-dimensional structures, comprising:

(a) providing a substrate;

(b) forming and adhering a first multi-material layer to a substrate, wherein the first multi-material layer comprises a desired pattern of at least one structural metal and at least one sacrificial metal;

(c) forming and adhering a subsequent multi-material layer to a previously formed layer, wherein the forming and adhering of the subsequent multi-material layer comprises:

a. selectively depositing at least one first metal using an adhered photoresist mask and thereafter removing the mask;

b. depositing at least one second metal after removal of the mask; and c. planarizing the at least one first metal and the at least one second metal of the subsequent multi-material layer to set a boundary level for the subsequent multi-material layer, wherein the at least one first metal and the at least one second metal comprise at least one structural material and at least one sacrificial material;

(d) repeating the forming and adhering operations of (b) and (c) at least once to build up a plurality of three-dimensional structures from a plurality of adhered multi-material layers;

(e) after the forming of the plurality of adhered layers, releasing the plurality of three-dimensional structures from the at least one sacrificial material;

(f) after formation of the plurality of layers, subjecting the multi-layer structure to a heat treatment, wherein a maximum effective temperature during heat treatment is less than a recrystallization temperature of a selected one of the at least one structural material and is in the range of 150° C.-350° C., wherein a post heat treatment intra-layer yield strength of the selected one of the at least one structural material is no less than 50% of a pre-heat treatment intra-layer yield strength of the selected one of the at least one structural material, and wherein the heat treatment is applied for a sufficient time, at a sufficient temperature, and in an environment that results in improved inter-layer adhesion after heat treatment such that the plurality of three-dimensional structures experience a reduced percentage of failures in inter-layer adhesion through an elastic deformation range of the structures (i.e. up to the beginning of the plastic deformation range of the structures) than would be present in absence of the heat treatment.

* * * * *